(12) United States Patent
Hegde

(10) Patent No.: US 7,497,248 B2
(45) Date of Patent: Mar. 3, 2009

(54) TWIN FIN ARRAYED COOLING DEVICE

(75) Inventor: Shankar Hegde, Bangalore (IN)

(73) Assignee: Hewlett-Packard Development Company, L.P., Houston, TX (US)

( * ) Notice: Subject to any disclaimer, the term of this patent is extended or adjusted under 35 U.S.C. 154(b) by 329 days.

(21) Appl. No.: 10/837,144

(22) Filed: Apr. 30, 2004

(65) Prior Publication Data

US 2005/0241800 A1    Nov. 3, 2005

(51) Int. Cl.
*H05K 7/20* (2006.01)

(52) U.S. Cl. .................... 165/80.3; 361/697; 361/710

(58) Field of Classification Search ............. 165/80.3, 165/121, 185; 361/697, 704
See application file for complete search history.

(56) References Cited

U.S. PATENT DOCUMENTS

| | | | | |
|---|---|---|---|---|
| 2,289,984 A * | 7/1942 | Mouromtseff et al. | ......... | 165/79 |
| 2,535,721 A * | 12/1950 | Chausson | .............. | 165/182 |
| 3,457,988 A * | 7/1969 | Meyerhoff et al. | ......... | 165/80.3 |
| 5,375,655 A | 12/1994 | Lee et al. | | |
| 5,964,285 A * | 10/1999 | Huang | .............. | 165/185 |
| 6,360,816 B1 | 3/2002 | Wagner | | |
| 6,367,542 B1 * | 4/2002 | Chen | .............. | 165/80.3 |
| D464,938 S | 10/2002 | Hegde | | |
| 6,505,680 B1 | 1/2003 | Hegde | | |
| 6,508,300 B1 | 1/2003 | Hegde | | |
| D471,523 S | 3/2003 | Hegde | | |
| D471,881 S | 3/2003 | Hegde | | |
| 6,543,522 B1 | 4/2003 | Hegde | | |
| 6,631,756 B1 * | 10/2003 | Hegde | .............. | 165/80.3 |
| 6,633,484 B1 * | 10/2003 | Lee et al. | .............. | 361/697 |
| 6,657,862 B2 * | 12/2003 | Crocker et al. | .............. | 361/697 |
| 6,680,015 B2 * | 1/2004 | McCullough | .............. | 264/105 |
| 6,714,415 B1 * | 3/2004 | Shah | .............. | 361/704 |
| 2002/0007936 A1 * | 1/2002 | Woerner et al. | .............. | 165/80.3 |
| 2002/0075654 A1 * | 6/2002 | Chen | .............. | 361/709 |
| 2002/0179290 A1 * | 12/2002 | Larson | .............. | 165/104.33 |
| 2003/0034150 A1 * | 2/2003 | Kozyra | .............. | 165/104.33 |
| 2003/0048608 A1 * | 3/2003 | Crocker et al. | .............. | 361/697 |
| 2004/0261975 A1 * | 12/2004 | Kozyra et al. | .............. | 165/80.3 |

FOREIGN PATENT DOCUMENTS

| | | |
|---|---|---|
| EP | 1081760 | 3/2001 |
| JP | 2000083343 A * | 3/2000 |

* cited by examiner

*Primary Examiner*—Allen J Flanigan

(57) ABSTRACT

A cooling device including a core with a plurality of twin fins connected with a plurality of grooves on the core is disclosed. Each twin fin includes a root and a pair of vanes extending from the root. Each root is connected with one of the grooves to mount the twin fins to the core. The core can be made from a high thermal conductivity material such as copper (Cu) or graphite so that heat conducted from a component in thermal communication with the core can be conducted upward into the core and spread out through the twin fins thereby reducing heat flux concentration. Heat dissipation from the core can be increased by increasing the number of grooves and twin fins, by increasing an area of the twin fins, and by reducing a thermal resistance of a means for connecting the root of the twin fins with the grooves.

39 Claims, 18 Drawing Sheets

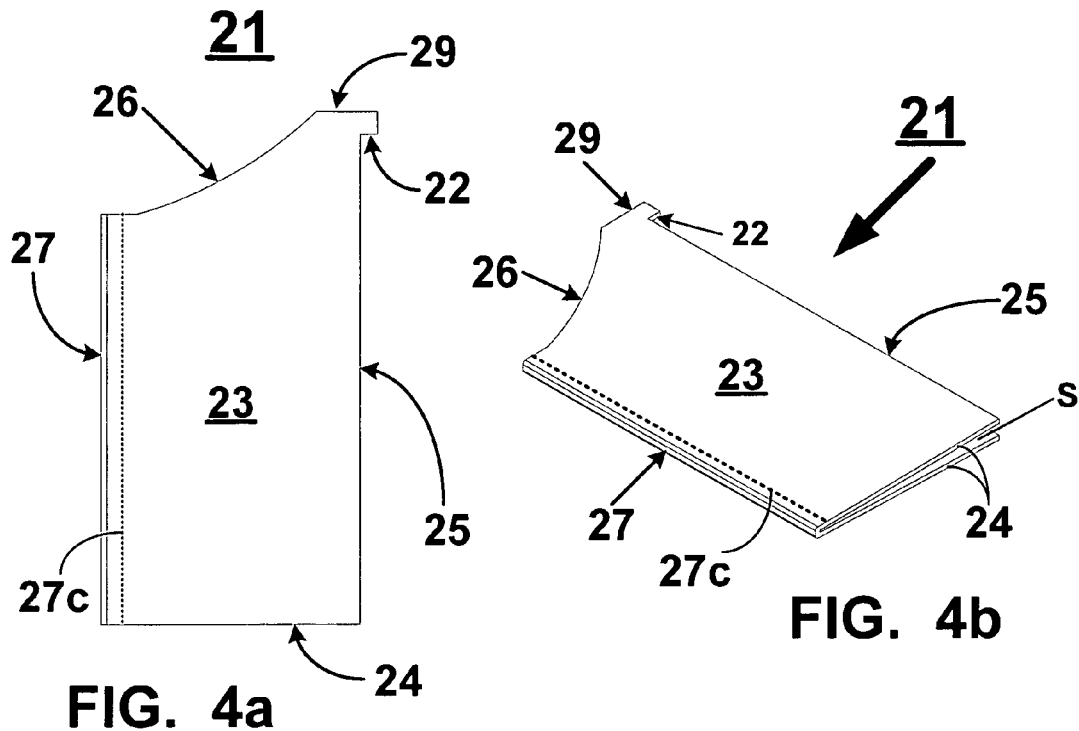
FIG. 4a
FIG. 4b
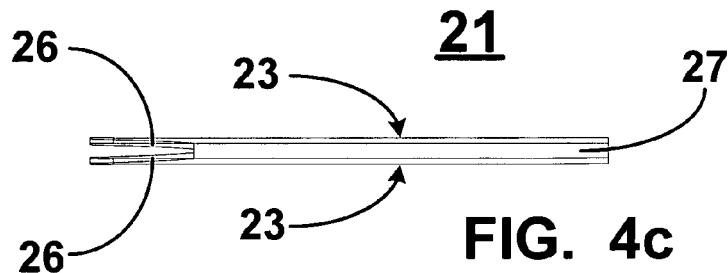
FIG. 4c
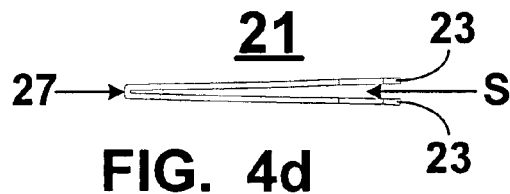
FIG. 4d
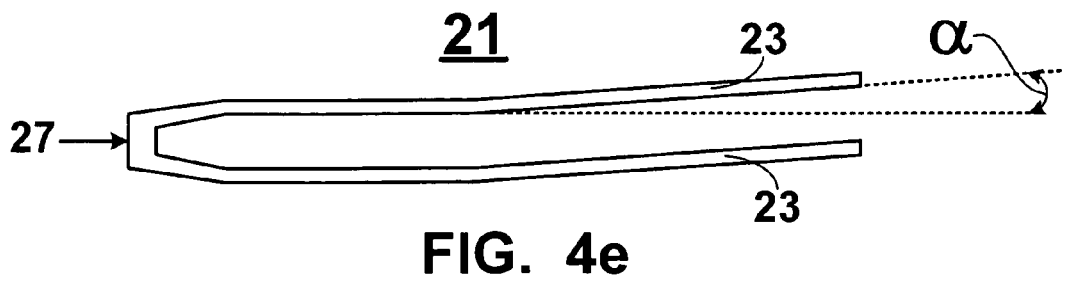
FIG. 4e

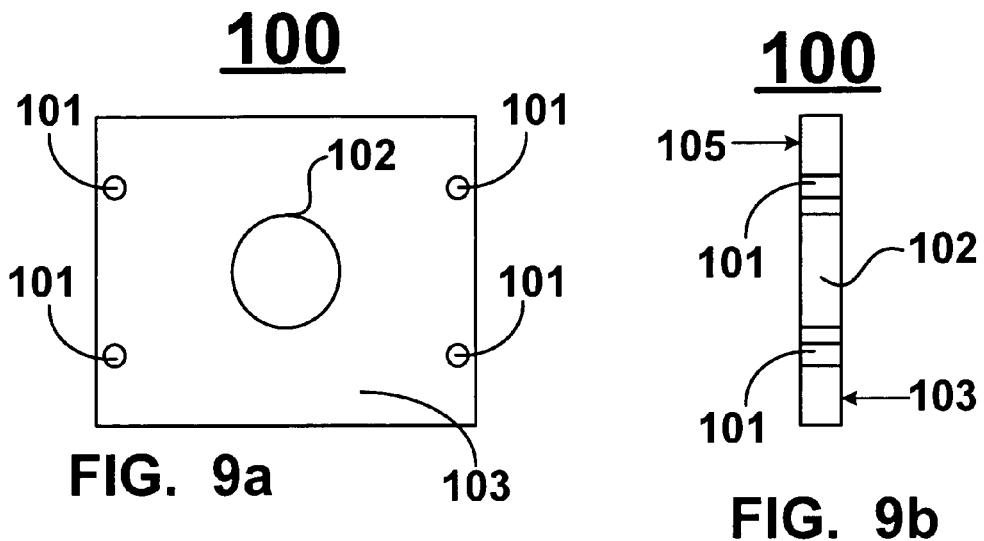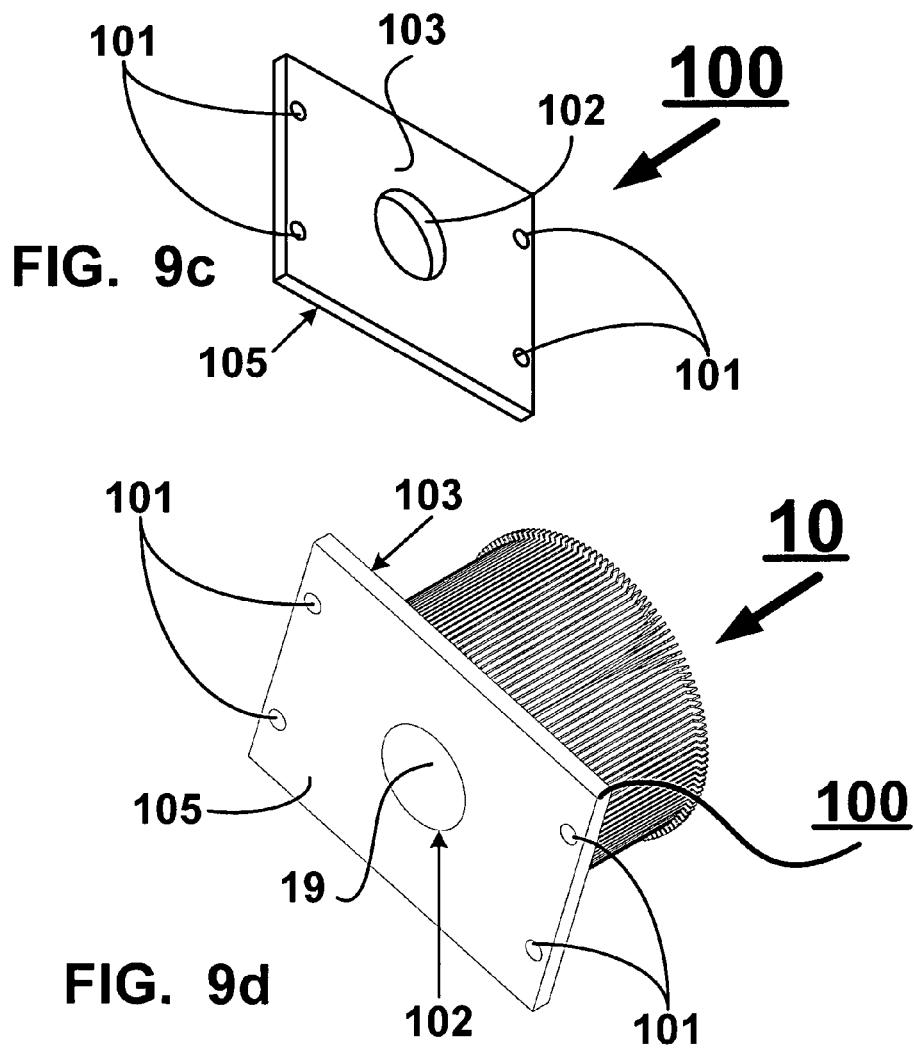

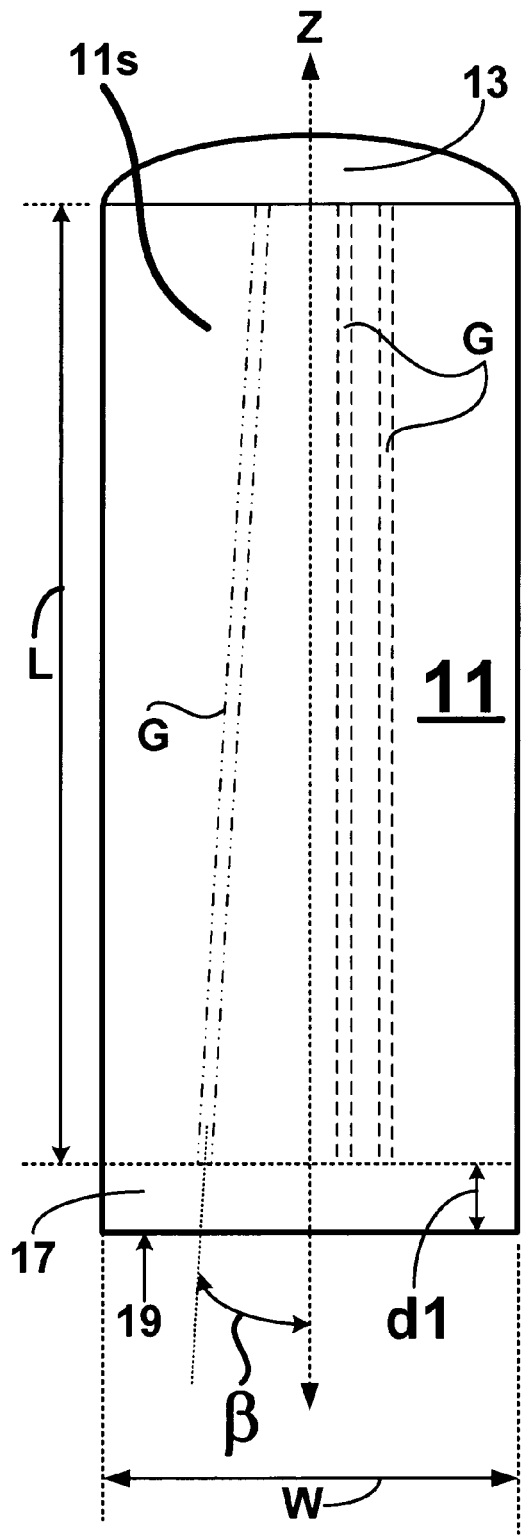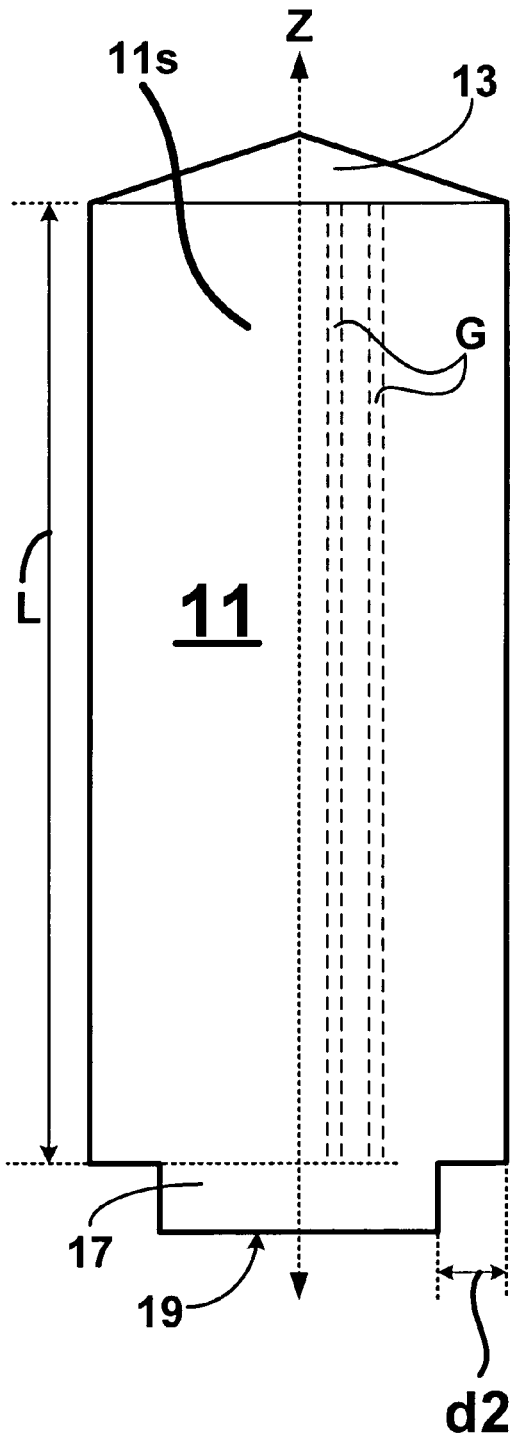
FIG. 10a
FIG. 10b

TWIN FIN ARRAYED COOLING DEVICE

FIELD OF THE INVENTION

The present invention relates generally to a cooling device for dissipating heat from a component in thermal communication with the cooling device. More specifically, the present invention relates to a cooling device with an array of twin fins connected with a plurality of grooves on the core.

BACKGROUND OF THE INVENTION

It is well known in the electronics art to place a heat sink in contact with an electronic device so that waste heat generated by operation of the electronic device is thermally transferred to the heat sink thereby cooling the electronic device. With the advent of high clock speed electronic devices such as microprocessors (CPU's), digital signal processors (DSP's), and application specific integrated circuits (ASIC), the amount of waste heat generated by those electronic devices and the operating temperature of those electronic devices are directly proportional to clock speed. Efficient operation of a CPU as well as other high power dissipation electronic devices requires that waste heat be continuously and effectively removed. However, as areal densities and clock speed of electronic devices continue to increase, a heat flux of the device also increases. Although air cooled heat sinks are a commonplace means for dissipating the waste heat from the aforementioned electronic devices, the increased heat flux in high performance electronic devices is often concentrated in a small area. The ability to effectively dissipate ever increasing levels of heat flux in high performance electronic devices has challenged current heat sink designs where the entire heat sink is fabricated using processes such as machining, forging, casting, and extrusion. Those processes make it difficult to increase the number of fins or an area of the fins in order to effectively dissipate heat cause by the aforementioned heat flux.

Heat flux is a thermal output per unit of area. For example, if a total thermal output is 100 Watts over a heat source having dimensions of 3.5 cm*3.5 cm, then the heat flux is 100 W/(3.5 cm*3.5 cm)=8.163 W/cm$^2$. At present, based on area and cost constraints, clock speeds in CPU's are being increase while the package area remains the same or is reduced. The higher clock speeds result in increased thermal output and a resulting increase in heat flux.

Consequently, there is a need for a cooling device with improved thermal conductivity that reduces heat flux concentration and efficiently dissipates waste heat from a device in thermal communication with the cooling device. There is also a need for a cooling device in which the number of fins and/or an area of the fins can be increased to dissipate heat from a device in thermal communication with the cooling device.

SUMMARY OF THE INVENTION

The cooling device of the present invention solves the aforementioned heat flux concentration problems. The cooling device includes a core with a plurality of grooves, a top face, and a base. The base includes a mounting surface for thermally connecting the core with a component to be cooled by the cooling device. A plurality of twin fins including a root adapted to be received by grooves on the core. Each twin fin includes a pair of vanes that extend outward of the root, with each vane including a leading, a trailing edge, an outer edge. The vanes are spaced from each other so that there is slot between adjacent vanes.

Waste heat from the component that is thermally conducted into the core via the mounting surface and is dissipated by an air flow over the vanes, the top face, the core, and through the slots to cool the component. The core conducts heat away from the component and upward towards the top face. The conducted heat spreads outward to the twin fins. The twin fins provide a large surface area for the heat to be dissipated from the core to an air flow that passes over the twin fins.

Enhanced thermal conductivity from the core to the twin fins is achieved by a low thermal resistance connection of roots of the twin fins with the grooves on the surface of the core. A high quality low thermal resistance connection can be made using a brazing or a soldering process to connect the roots with the grooves.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIGS. 4a through 4e are various profile views depicting a twin fin.
FIGS. 9a through 9c are top, cross-sectional, and bottom plan views of a base plate.
FIGS. 9d and 9e are bottom and top profile views respectively that depict a cooling device connected with a base plate.
FIGS. 10a and 10b are side views depicting grooves in a core.

DETAILED DESCRIPTION

Figure 1A:
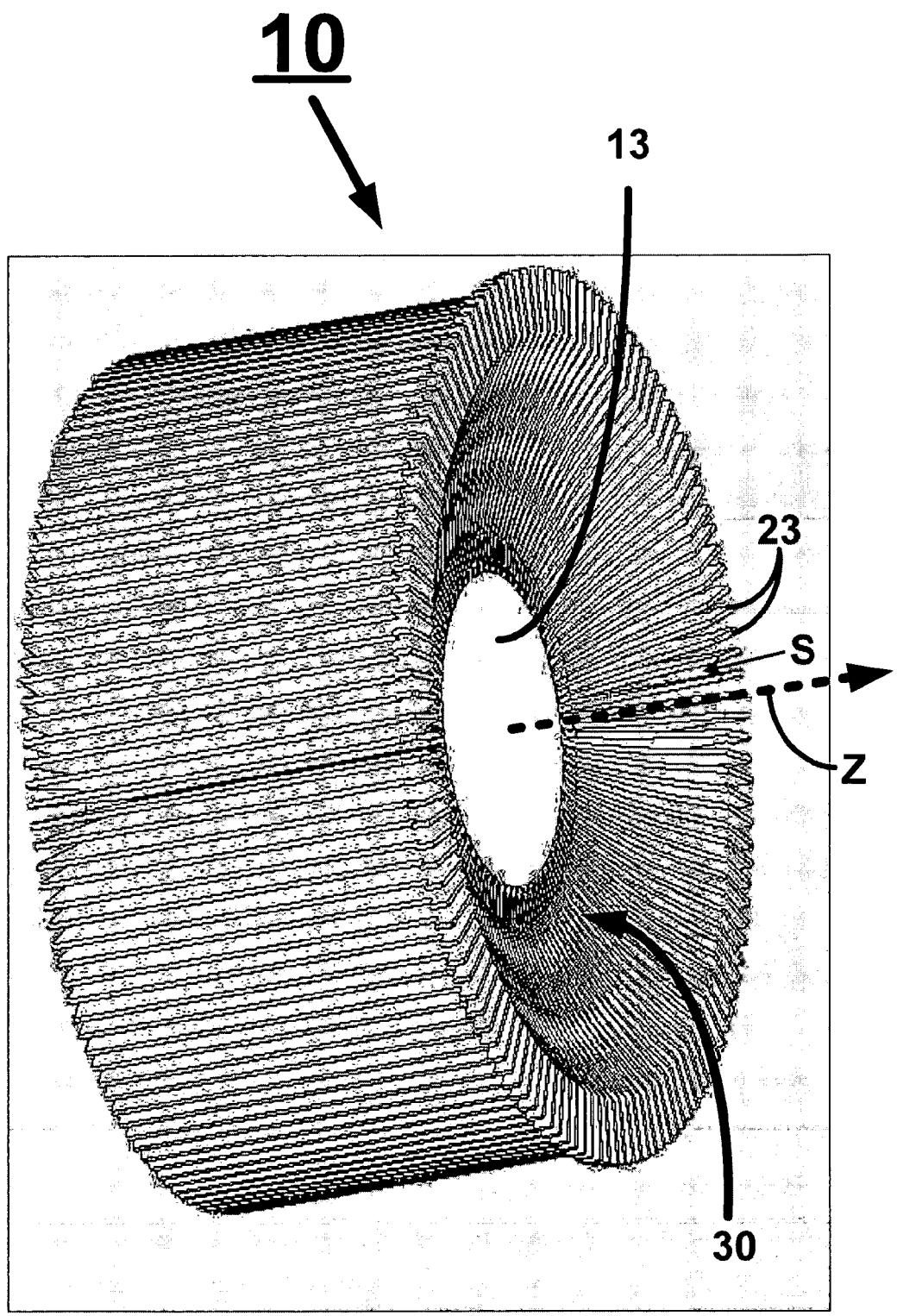
FIG. 1a is a top profile view depicting a cooling device.

In the following detailed description and in the several figures of the drawings, like elements are identified with like reference numerals.

As shown in the drawings for purpose of illustration, the present invention is embodied in a cooling device for dissipating heat from a component. The cooling device includes a plurality of twin fins and a core. Each twin fin includes a root and a pair of vanes extending outward of the root. The vanes are spaced apart from each other to define a slow between the vanes and each vane includes a leading edge, a trailing edge, and an outer edge. The core includes a top face and a base including a mounting surface for thermally connecting the core with the component to be cooled. The core also includes a plurality of grooves adapted to receive the root of the twin fins. Waste heat from the component that is thermally conducted into the core via the mounting surface is dissipated by an air flow over the vanes, the top face, the core, and through the slots to cool the component.

Figure 1B:
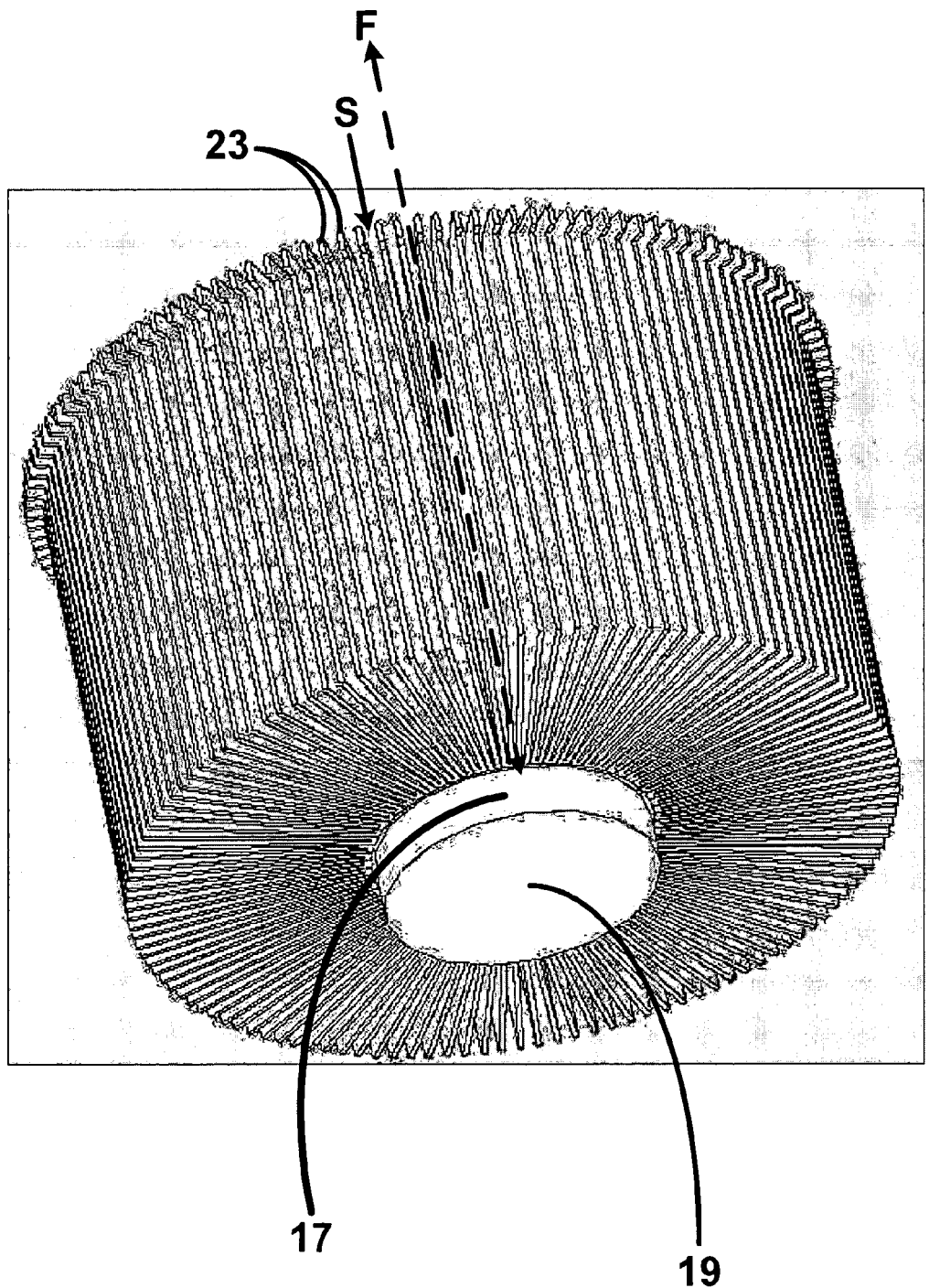
FIG. 1b is a bottom profile view depicting a cooling device.
Figure 2:
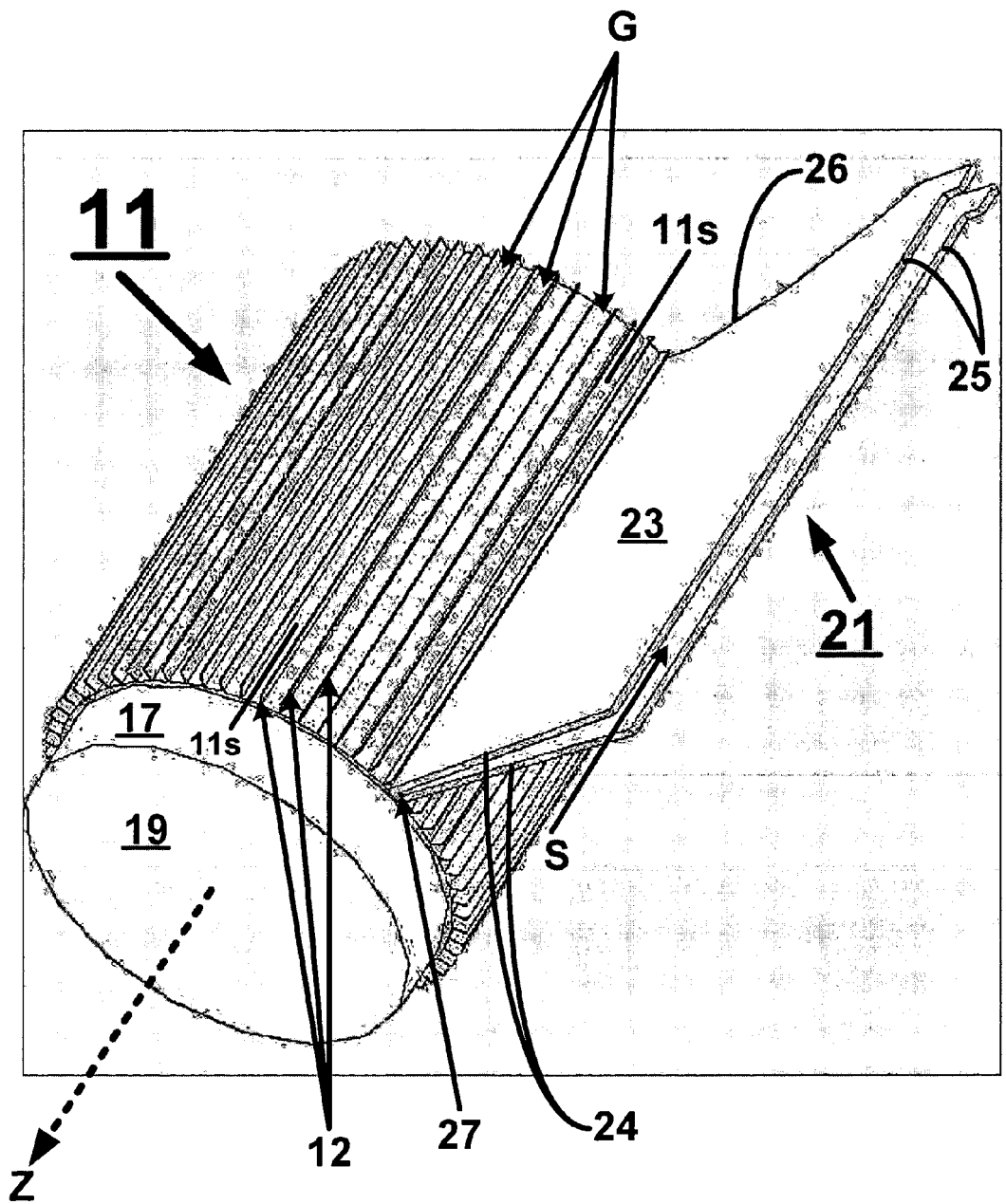
FIG. 2 is a profile view depicting a core and a twin fin.

In FIGS. 1a, 1b, 2, and 3, a cooling device 10 for dissipating heat from a component includes a plurality of twin fins 21 with each twin fin 21 including a root 27 and a pair of vanes 23 extending outward from the root 27. The vanes 23 are spaced apart from each other to define a slot S between the vanes 23. In FIG. 2, each vane 23 includes a leading edge 26, a trailing edge 24, and an outer edge 25. The cooling device 10 also includes a core 11 with a plurality of grooves G, a top face 13, and a base 17. The base 17 includes a mounting surface 19 that is adapted to thermally connect the core 11 with a component to be cooled (not shown). As will be described below, the thermal connection between the mounting surface 19 and the component can be via a direction connection between the mounting surface 19 and the component or via a thermal interface material that is connected with the mounting surface 19 and the component.

The grooves G are adapted to receive the root 27 of the twin fins 21. As depicted in FIG. 2, the grooves can be formed by a pair of spaced apart projections 12 that extend outward of a surface 11s of the core 11. A space between adjacent projections 12 is sufficient to receive a width 27w of the root of the twin fin 27. Alternatively, in FIG. 7, the groove G can extend inward of the surface 11s and the groove G can include a width and a depth sufficient to receive the root 27 of the twin fins 21. As will be described below, the grooves G can be aligned with an axis Z of the core 11 or the grooves G can be at an angle with the axis Z. The number of grooves G can be determined by the number of twin fins 21 the cooling device 10 is to have.

In FIG. 1b, waste heat from a component (not shown) is thermally conducted into the core 11 through the mounting surface 19. The waste heat is dissipated by an air flow F that passes over the vanes 23, the top face 13, the core 11, and through the slots S between the vanes 23. The air flow F can be from an air flow source such as a fan, for example.

Figure 3:
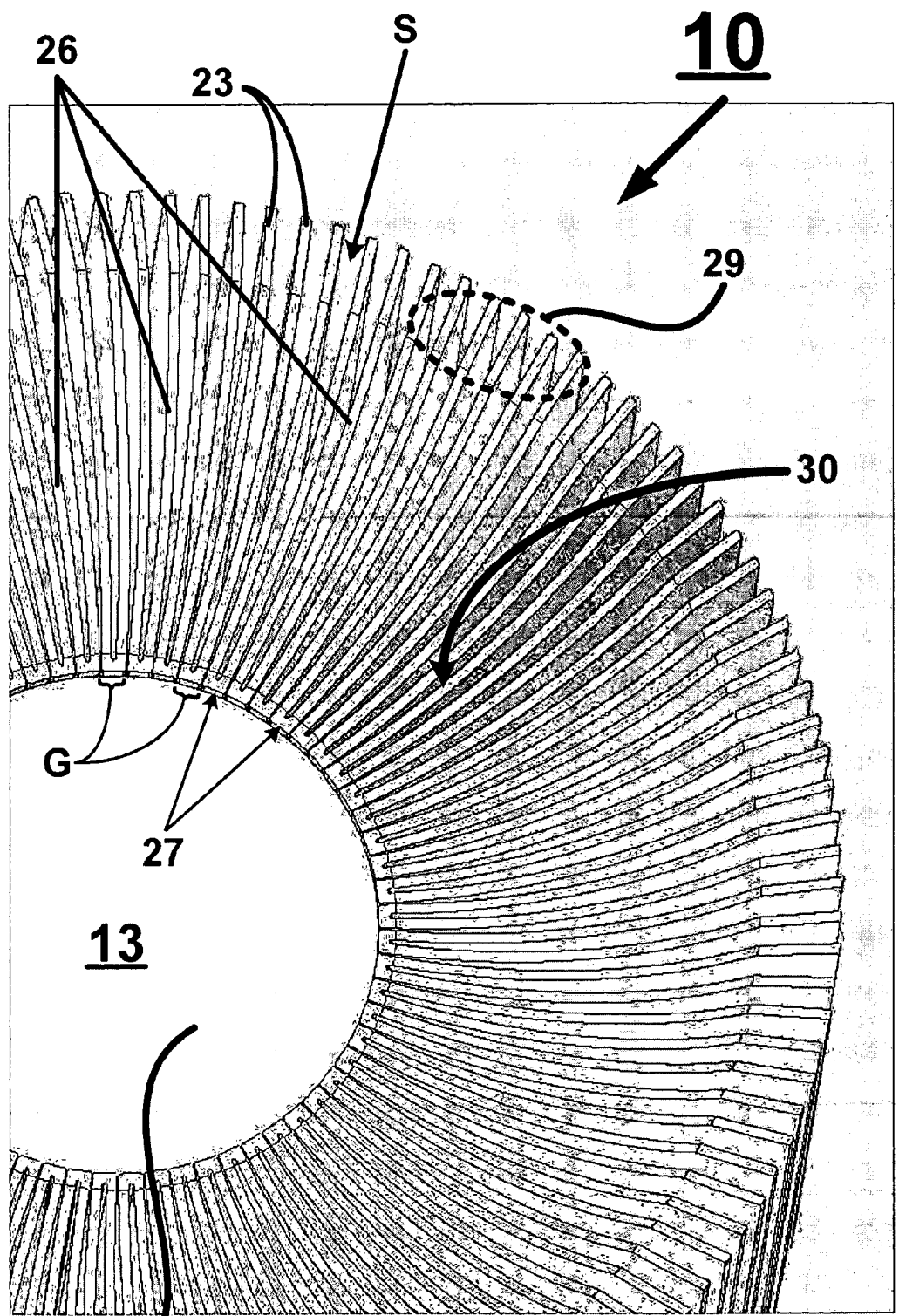
FIG. 3 is an enlarged profile view depicting a plurality of twin fins connected with a plurality of grooves.

In FIG. 3, a close up view of the device 10 depicts a plurality of the twin fins 21 with their respective roots 27 connected with the grooves G on the core 11 such that the twin fins 21 form an array of fins that surround the core 11. The leading edge 26 of the vanes 23 define a chamber 30 that surrounds the top face 13. A top portion of the vanes 29 can be a substantially planar surface for mounting an air flow device, such as a fan, for example, over the chamber 30.

In FIGS. 4a through 4d, each twin fin 21 includes a root 27 that is common to both vanes 23, an outer edge 25, a trailing edge 24, a leading edge 26, and optionally a surface 29 adapted to allow an air flow device to be mounted with the cooling device 10. Moreover, the outer edge 25 of the vane 23 can include a lip 22 that extends outward of the outer edge 25. The lip 22 provides a surface against which a mounting ring (not shown) can be mounted for connecting an air flow device with the cooling device 10.

In FIGS. 4a and 4b, the leading edge 26 of the vane 23 can include a profile that is straight (i.e. planar), an arcuate, a sloped, or a composite profile that is combination of one or more of the straight, arcuate, and sloped profiles. The profile can be selected to control the air flow F in the chamber 30, over the top face 13, over the vanes 23, and through the slot S. The profile may also be selected to complement a shape of a fan blade that is positioned in the chamber 30 to provide the air flow F. Although the trailing edge 24 is depicted as being substantially planar, the trailing edge 24 may also be profiled and can include a straight, an arcuate, a sloped, or a composite profile that is combination of one or more of the straight, arcuate, and sloped profiles. The slots S between the vanes 23 can diverge from the root 27 to the outer edge 25 so that the slot S widens in a direction from the root 27 to the outer edge 25.

The root 27 and a portion 27c (see dashed lines) of the vanes 23 may be coated with a material including but not limited to an adhesive, a glue, a solder, or a brazing compound to effectuate a connection of the twin fins 21 with the grooves G in the core 11. Because the portion 27c will come into contact with the projections 12 (see FIG. 2) or the a wall of the groove G (see FIG. 7), it may be desirable to coat the portion 27c with the aforementioned material to ensure the twin fin 21 is fixedly connected with the core 11. Thermal transfer of waste heat from the core 11 to the twin fins 21 can be reduced if the connection between the root 27 and the groove G is not snug and/or any portion of the root 27 is not in contact with the core 11.

Figure 5A:
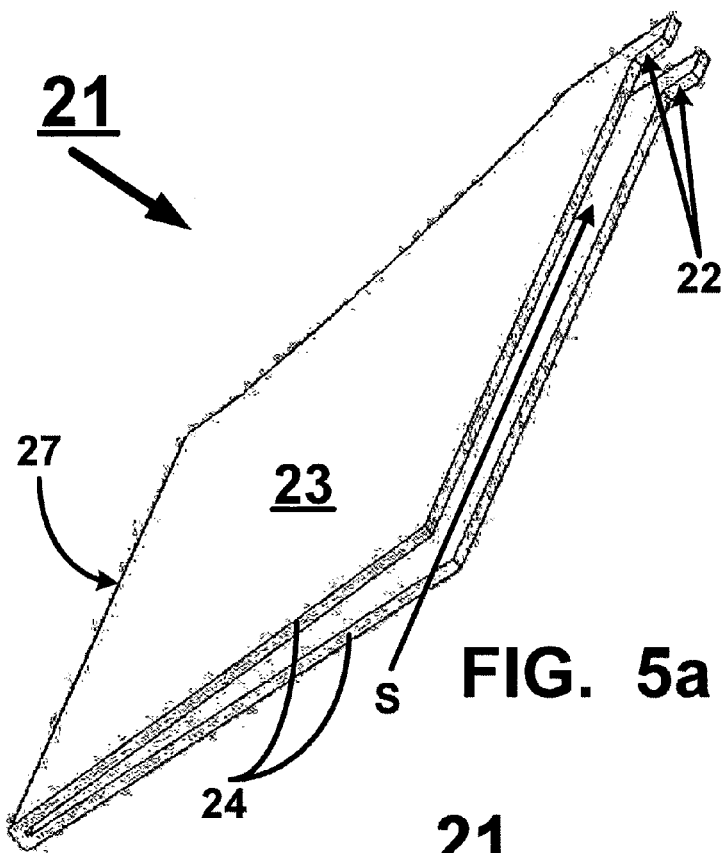
FIGS. 5a and 5b are profile views depicting a twin fin.
Figure 5B:
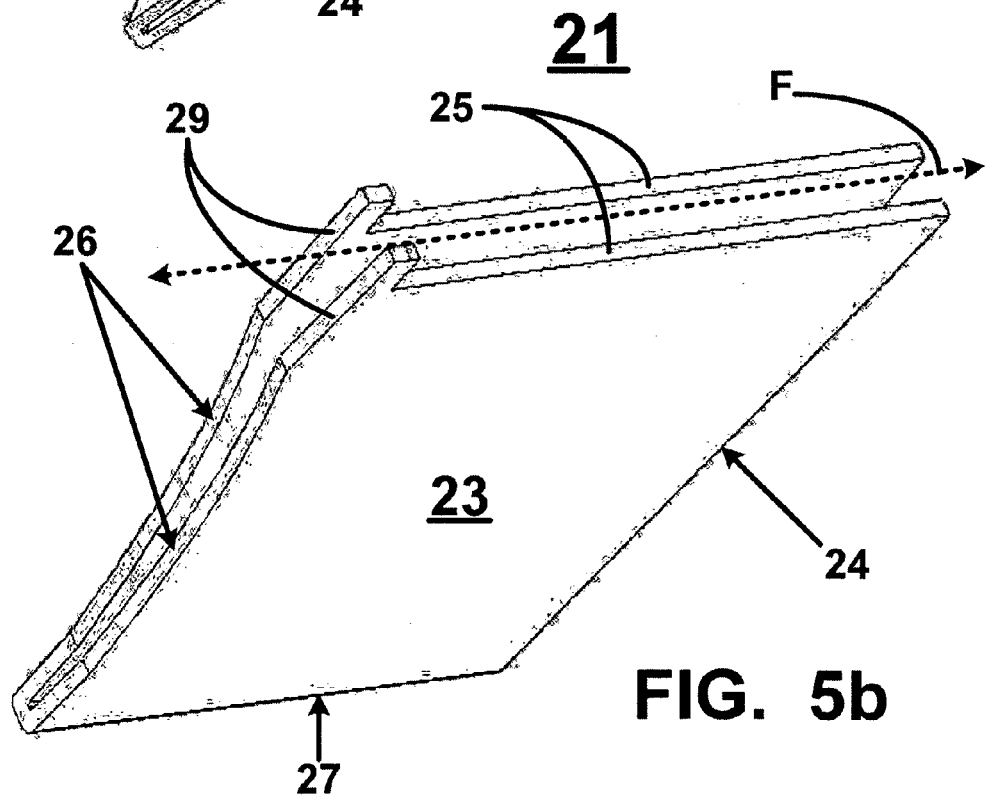

In FIGS. 5a and 5b, the vanes 23 of the twin fins 21 include a planar profile, that is, each vane 23 is a substantially flat surface from the root 27 to the outer edge 25. On the other hand, in FIGS. 6a and 6b, the vanes 23 include an arcuate profile denoted by arrows 23a. Accordingly, the vanes are not a substantially planar surface. The vanes 23 can also include an angular profile (see FIG. 4e) wherein the vanes 23 have one or more portions that are at an angle $\alpha$ with respect to another portion of the vane 23 or with respect to some predetermined reference point on the twin fin 21 or the core 11.

Figure 6A:
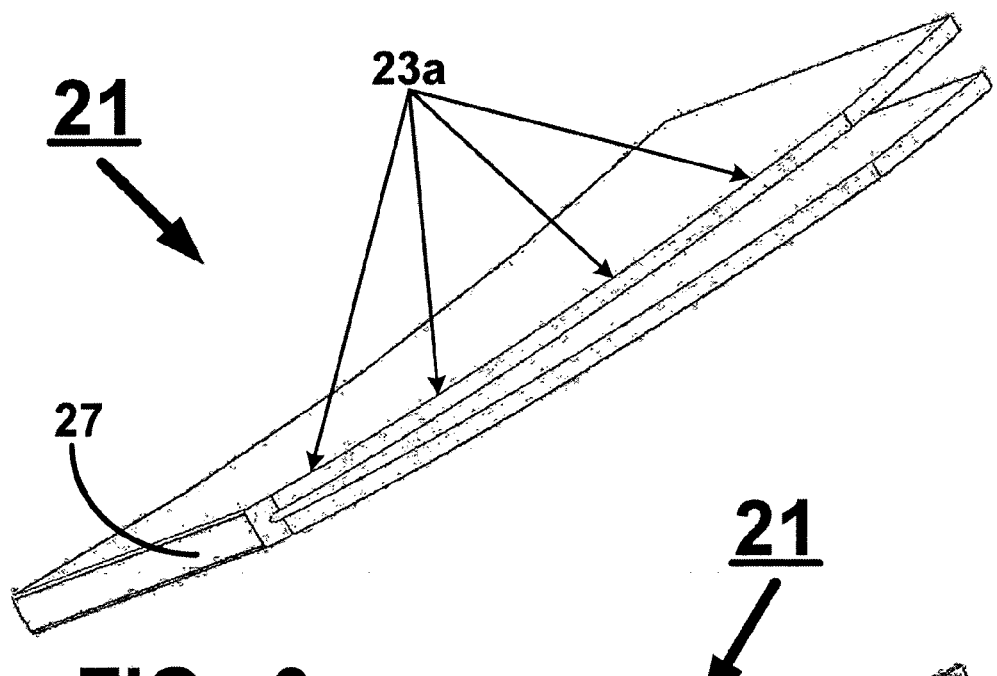
FIG. 6a and 6b are profile views depicting an arcuate profile on vanes of a twin fin.
Figure 6B:
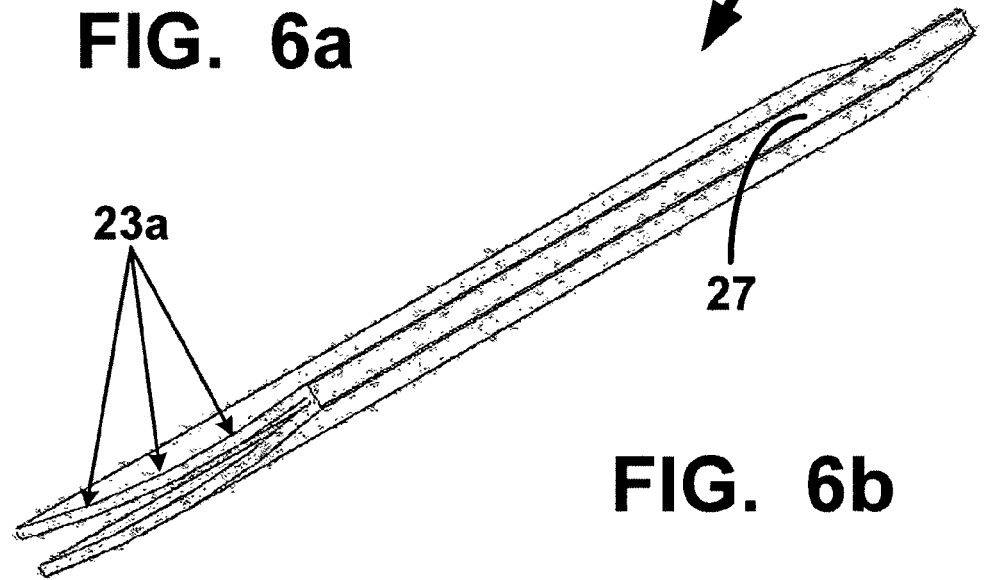
Figure 6C:
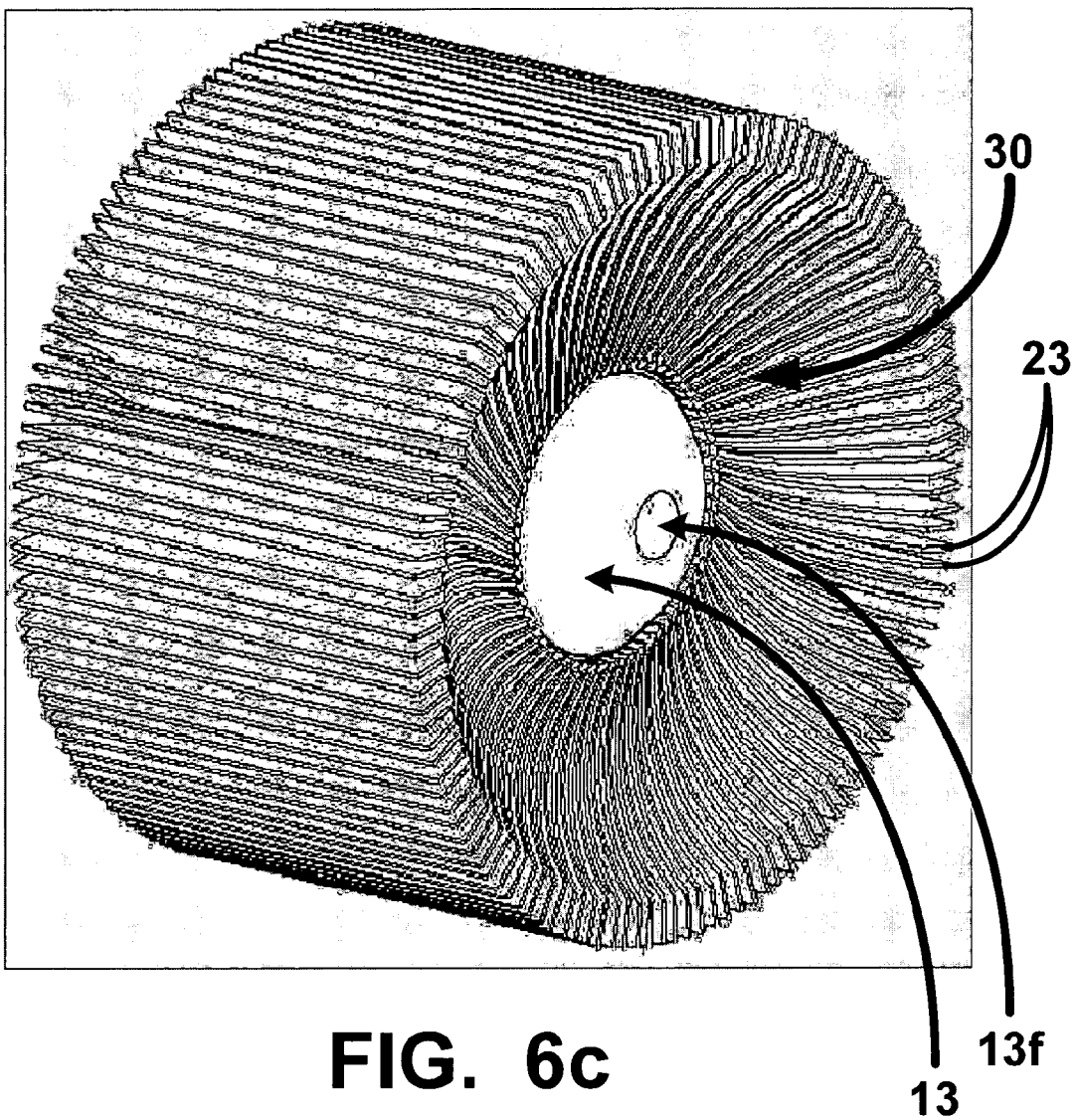
FIG. 6c is a profile view depicting a cooling device including twin fins with arcuate profiles on the vanes.

In FIG. 6c, the cooling device 10 can include twin fins 21 with vanes having the arcuate profile 23a of FIGS. 6a and 6b. The arcuate profile 23a can be selected to be tangential to a point on the core 11, such as a circle of a predetermined diameter and centered about the axis Z of the core 11. As an example, the arcuate profile 23a can be selected to match a curvature of a fan blade (not shown) on a fan that is mounted over the chamber 30. Matching a curvature of the vanes 23 with a curvature of the fan blade can result in lower air shock noise caused by the air flow F moving over the vanes 23 and through the slot S.

Figure 16:
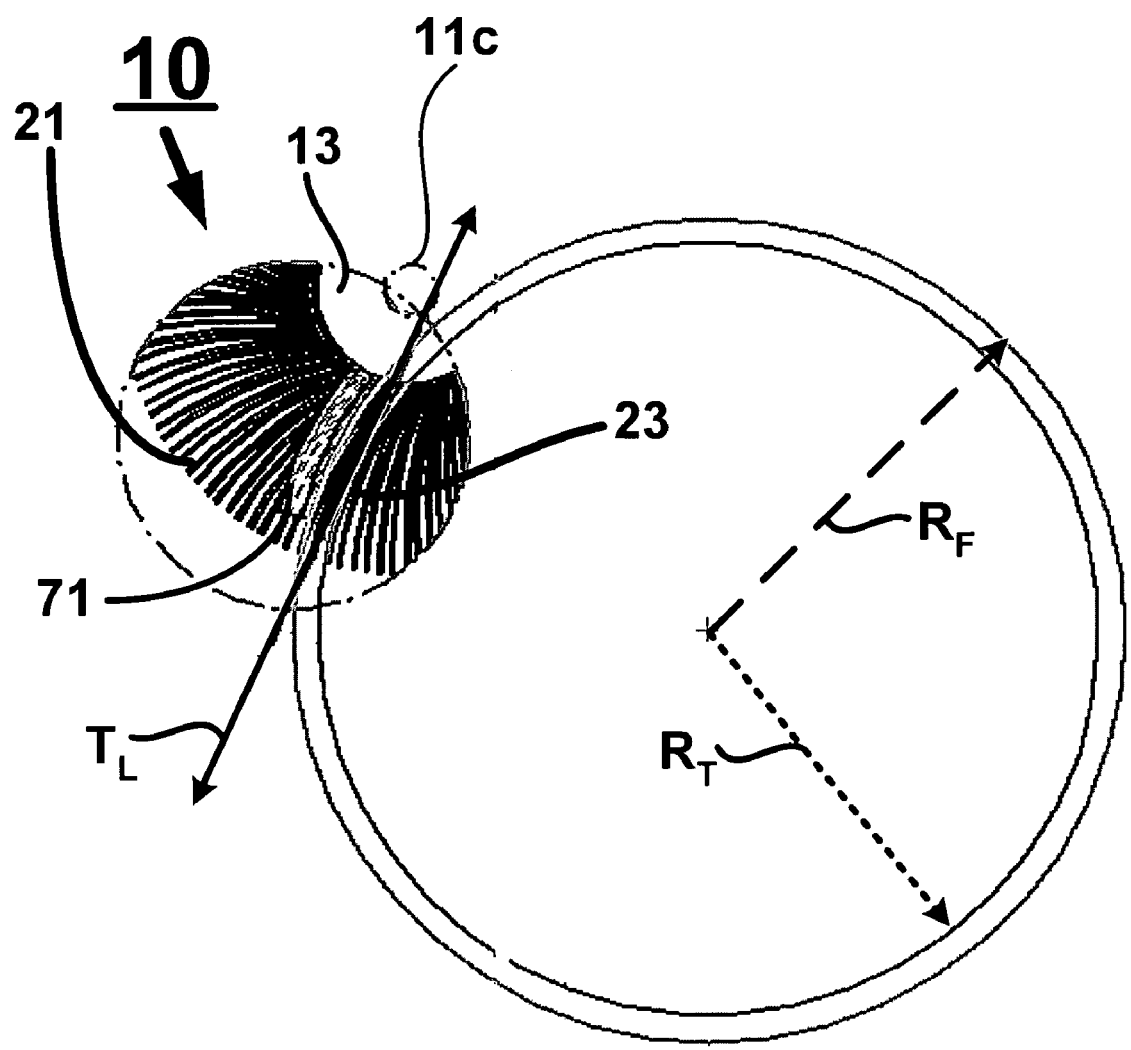
FIG. 16 is a diagram depicting a tangential relationship between a curvature of a vane and a fan blade.

In FIG. 16, a circle 11c centered about the axis Z of the core 11 has a tangent line $T_L$ that is tangent to the circle 11c and to a curvature of the arcuate profile 23a of vanes 23 as denoted by a second circle having a radius $R_T$ that is equal to a distance from the root 27 to the outer edge 25 of the twin fins 21. A second radius $R_F$ represents a radius of a fan blade 71 (shown superimposed over the vanes 23) from a center of a hub of a fan (not shown). The curvature of the fan blade 71 matches the arcuate profile 23a of the vanes 23 such that the two circles defined by radius lines ($R_T$ and $R_F$) are concentric with each other.

Figure 7:
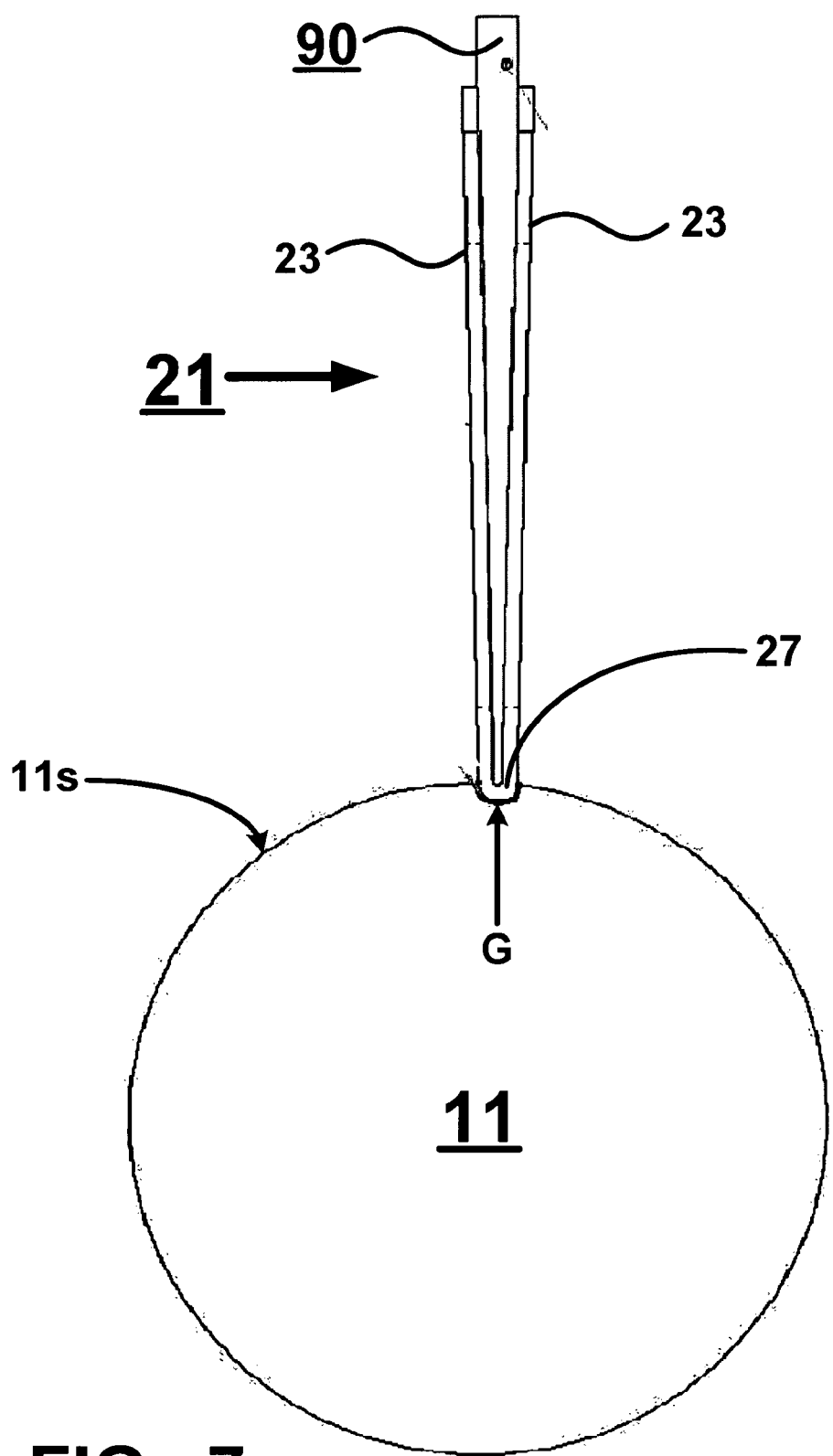
FIG. 7 is a cross-sectional view depicting an insertion of a twin fin into a groove.

In FIG. 7, the root 27 can be inserted into the groove G by using a tool 90. The tool 90 can complement a shape of the slot S and the tool 90 can be used to push the root 27 into the groove G so that the root 27 is firmly connected with the groove G and the root 27 is in contact with the groove G substantially over its entire length along the core 11. As an example, the twin fin 21 can be fixedly connected with the groove G by applying a solder or the like to the root 27 and/or the groove G prior to the insertion, and then soldering the root 27 in the groove G. The tool 90 can be used to hold the root 27 in the groove G so that the twin fin 21 does not move during the connection process.

Similarly, a brazing process can be used to connect the root 27 with the groove G. To enhance thermally conductivity between the core 11 and the twin fin 21, a thermal sealant or a thermal interface material can be positioned in the groove G or on the root 27 prior to insertion. Although not depicted in FIG. 7, the above processes can be used when the groove G is formed by the projections 12 of FIG. 2. Other methods can be used to connect the root 27 with the groove G and the present invention is not to be construed as being limited to the methods disclosed herein. For instance, welding, vacuum brazing, adhesives, and gluing are examples of other methods to effectuate a connection of the roots 27 with the grooves G.

Figure 8A:
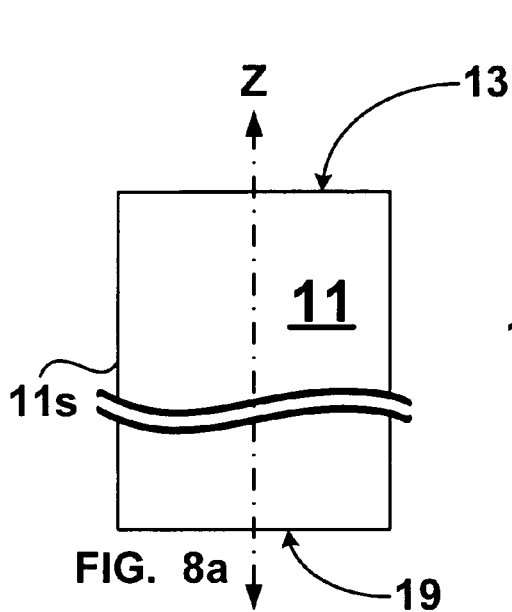
FIGS. 8a through 8g are cross-sectional views depicting core and top face profiles.
Figure 8B:
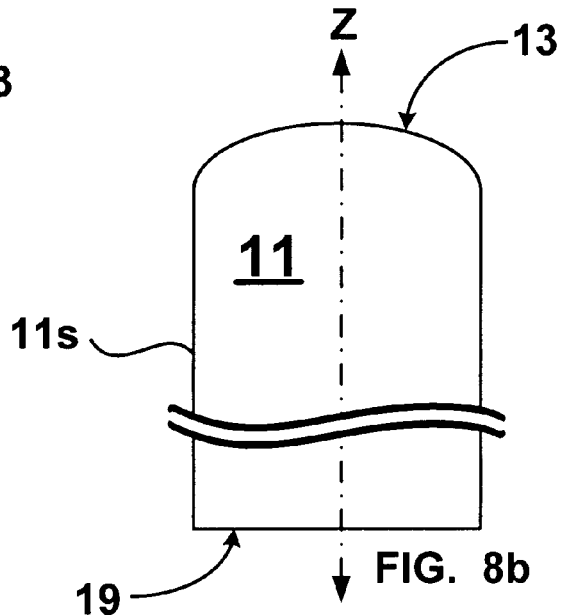
Figure 8C:
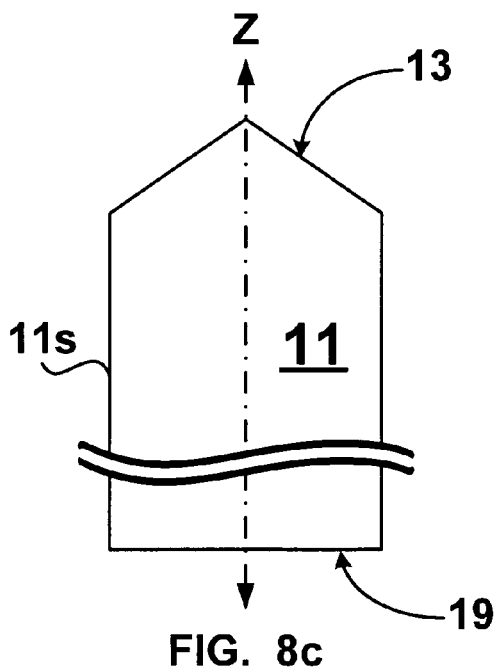
Figure 8D:
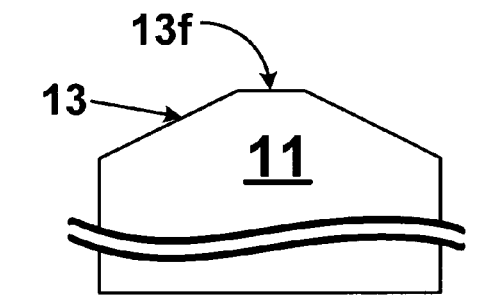
Figure 8E:
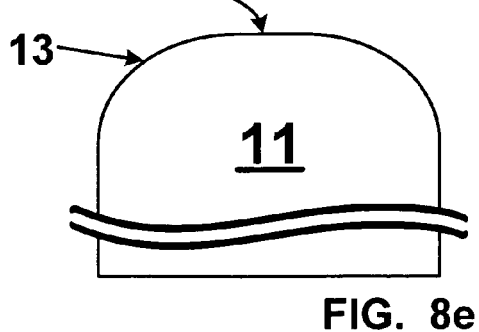
Figure 8G:
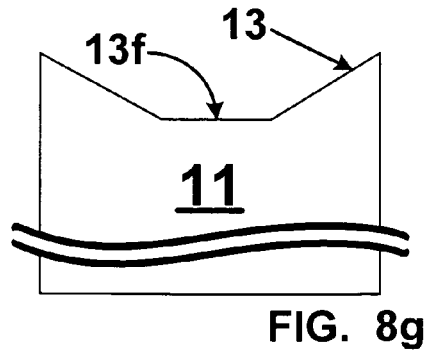
Figure 8F:
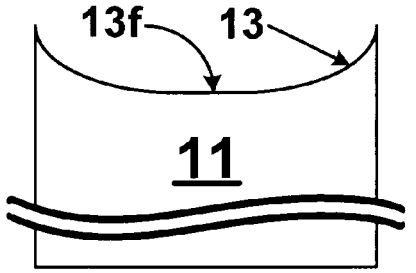

In FIGS. 8a through 8f, various configurations for the top face 13 of the core 11 are depicted. The top face 13 can include a planar profile in FIG. 8a, an arcuate profile in FIG. 8b, and a sloped profile in FIG. 8c. In FIGS. 8d and 8e, the sloped and arcuate profiles can terminate at a frustum 13f. In FIGS. 8f and 8g, the top face 13 includes concave arcuate and concave sloped profiles respectively, and those profiles can include the frustum 13f. The profile of the top face 13 can be selected based on air flow management in the chamber 30 and/or to increase the air flow F over the top face 13 to enhance heat transfer from the core 11 to the air flow F.

In FIGS. 9a through 9c, a base plate 100 includes a top surface 103, a bottom surface 105, and an aperture 102 between the top and bottom surfaces (103, 105). The base plate 100 can include mounting holes 101 for receiving a fastener, such as a machine screw, for example. The fastener can be used to mount the base plate 100 on a PC board that carries the component to be cooled by the cooling device 10. The base plate 100 positions the mounting surface 19 of the core 11 in thermal contact with the component. The aperture 102 is adapted to receive the base 17 of the core 11.

For example, the base 17 can be inserted into the aperture 102 as depicted in FIG. 9d. The base 17 can be retained in the aperture 102 by a variety of methods including but not limited to welding, friction stir welding, soldering, brazing, gluing, or by a friction fit between the base 17 and the aperture 102.

Figure 9E:
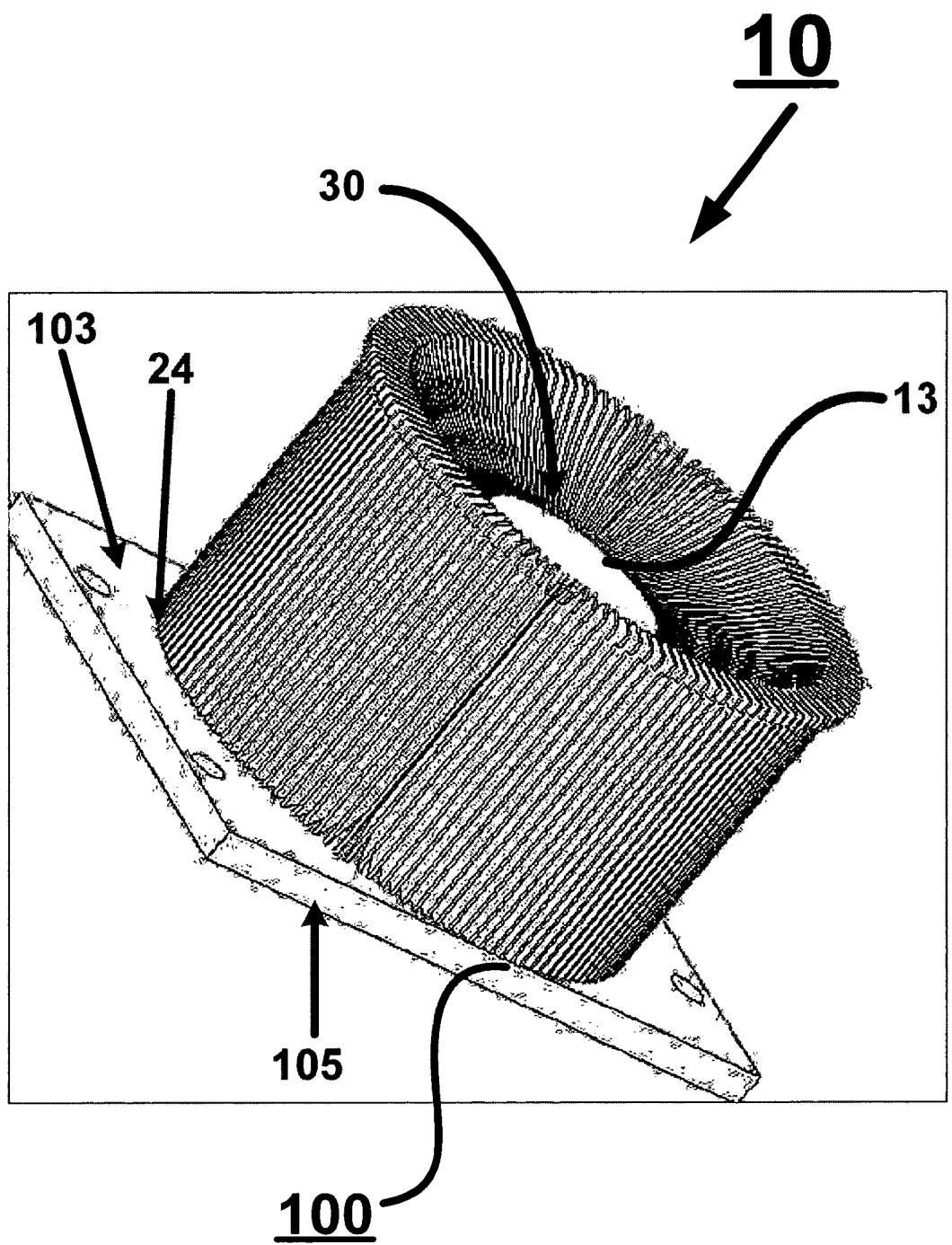

The mounting surface 19 may or may not be flush with the bottom surface 105. In FIG. 9e, after mounting the cooling device to the base plate 100, the trailing edges 24 of the twin fins 21 may rest on the top surface 103 or they may be positioned above the top surface 103. In some cases, it may be desirable for air flow management for the trailing edges 24 to be positioned above the top surface 103 so that the air flow F can enter or exit the slots S without restriction.

The base plate 100 can have any shape and is not limited to the rectangular shape depicted herein. The base plate 100 can have any shape that can accommodate a bore through which the cooling device 10 can be connected with the base plate 100 and mounting holes to mount the base plate 100 over the component to be cooled.

In FIGS. 10a and 10b, the grooves G include a length L that can substantially span an entirety of a length of the surface 11s of the core 11. The root 27 of each twin fin 21 can have a length that is substantially equal to the length L of the grooves G. In FIG. 10a, the grooves G come short of extending all the way down to the mounting surface 19 by a distance d2 so that the base 17 can be inserted into a mounting means such as the aforementioned aperture 102 in the base plate 100. The distance d2 can be 0.25 inches or less, for example. Accordingly, the length L spans a substantial entirety of the surface 11s. The grooves G can be aligned with an axis Z of the core 11 or the grooves G can have an angular orientation β with the axis Z. In FIG. 10b, the base 17 can be inset from the surface 11s of the core 11 as depicted by the distance d2. The inset distance narrows a width of the base 17 and can be sized to match a width of the aperture 102 in the base plate 100.

Figure 10C:
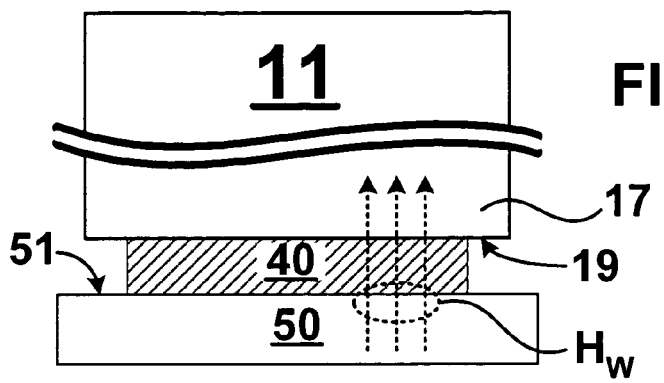
FIGS. 10c and 10d are cross-sectional views depicting a base, a mounting surface, and a thermal interface material.
Figure 10D:
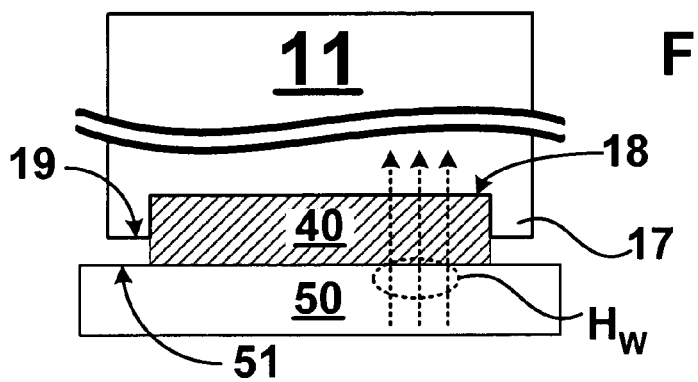

In FIG. 10c, a thermal interface material 40 can be positioned on the mounting surface 19. The thermal interface material 40 reduces thermal resistance between a surface 51 of a component 50 and can seal micro voids on the surface 51 thereby enhancing thermal transfer of waste heat $H_W$ from the component 50 to the core 11. In FIG. 10d, the mounting surface 19 includes a cavity 18 inset from the mounting surface 19. A thermal interface material 40 can be positioned in the cavity 18 and the thermal interface material 40 can be flush with the mounting surface 19 or may extend inward or outward of the mounting surface 19.

Figure 11:
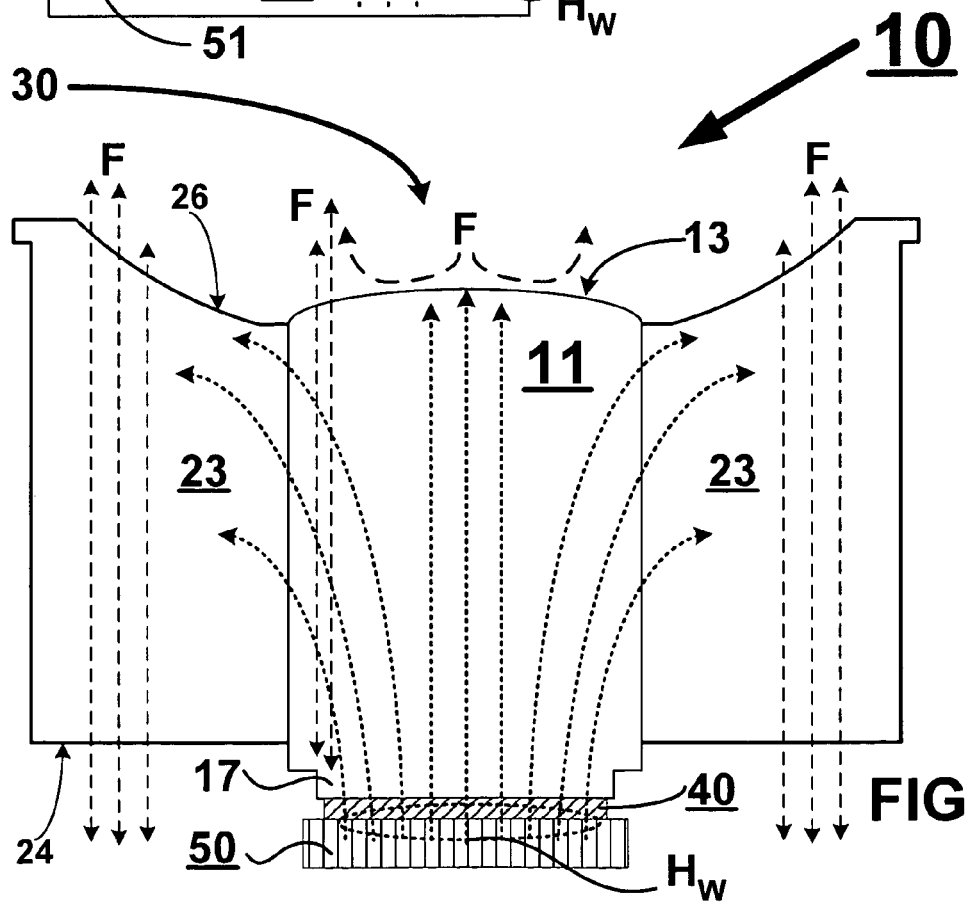
FIG. 11 is a cross-sectional view depicting heat flow and air flow in a cooling device.

In FIG. 11, the air flow F can flow from the leading edge 26 to the trailing edge 24 or from the trailing edge 24 to the leading edge 26. Accordingly, an air flow source, such as a fan, can either push or pull air through the slots S and over the vanes 23. The air flow F entering the chamber 30 can also circulate over the top face 13 to dissipate the waste heat $H_W$ from the core 11. Because the core 11 can have a long length L relative to a width W of the core 11 (see FIG. 10a), the waste heat $H_W$ transferred from the component 50 is thermally conducted up the core 11 towards the top face 13 and spreads out towards the surface 11 s where the roots 27 of the twin fins 21 thermally communicate a substantial portion of the waste heat $H_W$ into the vanes 23 where it is transferred to the air flow F. As described above, the roots 27 and grooves G can span substantially all of the length L so that the waste heat $H_W$ is transferred from the core 11 to the twin fins 21 along the entire length of the roots 27. The core 11 can be made from a high thermal conductivity material (e.g. copper or graphite) that efficiently conducts the waste heat $H_W$ upward along the axis Z and outward towards the twin fins 21 so that the waste heat $H_W$ is spread over a much larger area; thereby, reducing heat flux concentration at the surface 51 of the component 50. Essentially, the core 11 provides a low resistance thermal path to dissipate the waste heat $H_W$ from the component 50.

Figure 12:
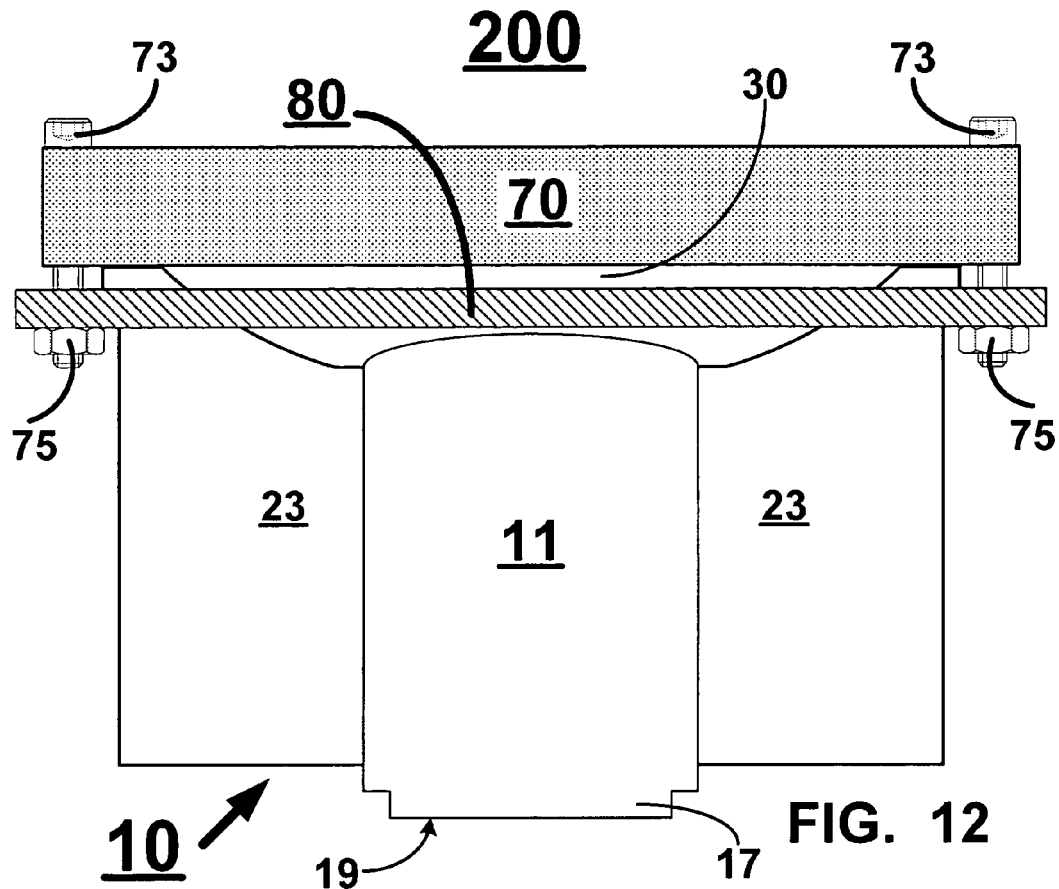
FIG. 12 is a side profile view depicting an air flow device mounted to a cooling device using a mounting ring.

In FIG. 12, as one example of an air flow device, a fan 70 can be mounted on the cooling device 10. Mounting can be by a mounting ring 80 that abuts with the lips 22 on the outer edges 25 of the vanes 23. Fasteners 73 and 75 (e.g. a nut and bolt) can be used to connect the fan 70 with the mounting ring 80. The blades of the fan 70 may be positioned inside the chamber 30 or outside the chamber 30.

Figure 13:
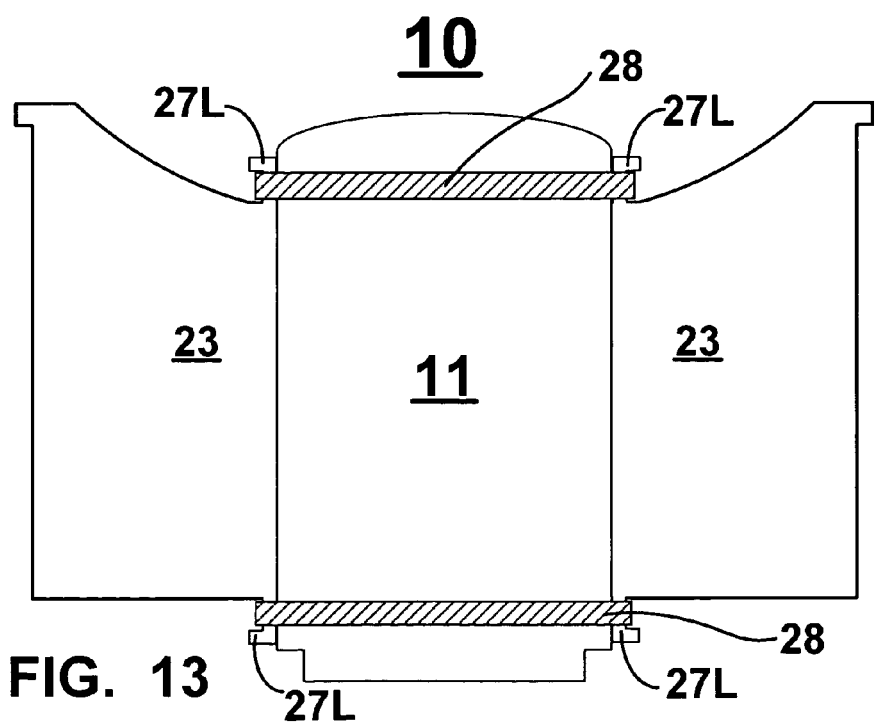
FIG. 13 is a side profile view depicting a clamp for connecting a plurality of twin fins to a core.

In FIG. 13, the roots 27 of the twin fins 21 can be connected with the grooves G using a clamp 28 that clamps around ears 27L on the root 27. The clamp 28 can be a C-clamp, a clamping ring, or the like and can exert a force on the roots 27 that urge the roots 27 into contact with the grooves G. As described above, a thermal interface material or a thermal sealant material can be applied to the roots 27 and/or the grooves G to reduce thermal resistance between the core 11 and the twin fins 21.

Figure 14:
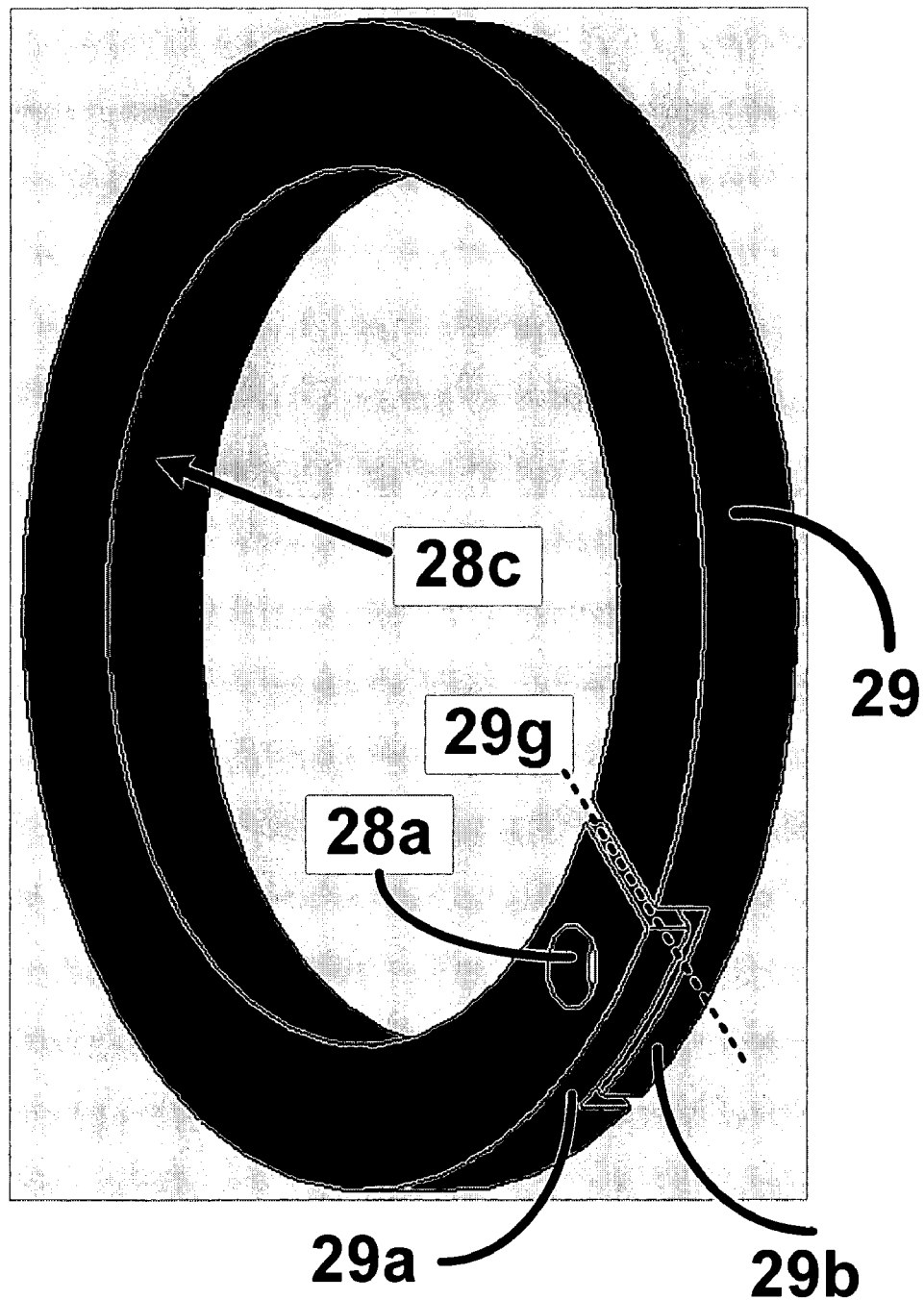
FIG. 14 is a profile view depicting a clamp.

As one example, in FIG. 14, the clamp 28 can include a clamp body 29 with a gap 29g (see dashed line) in the clamp body 29. At the gap 29g, the clamp body 29 is split into two parts 29a and 29b with an aperture 28a extending into both parts (29a, 29b). The aperture 28a can receive a fastener or the like to bring the two parts 29a and 29b together so that a clamping force is exerted on the roots 27 of the twin fins 21 by a clamping surface 28c so that the roots 27 are urged into contact with the groove G. As described above, in order to ensure a low thermal resistance connection between the roots 27 and the grooves G along the entire length of the grooves G, a thermal sealant or thermal interface material can be used.

The twin fins 21 can be made from a variety of thermally conductive materials including but not limited to aluminum (Al), copper (Cu), silver (Ag), gold (Au), and alloys of those materials, and a high thermal conductivity resin. Preferably, the vanes 23 and the root 27 are a homogenous unit, that is, they are a unitary whole. The twin fins 21 can be manufactured using a pressing or stamping process. A bending or rolling process can be used to form the arcuate profile 23a or to form an angular or non-planar profile on the vanes 23. As an example, the twin fins 21 can be stamped from a sheet of material, such as a copper (Cu) sheet. As another example, the twin fins 21 can be molded from a high thermal conductivity material such as a resin or a carbon fiber re-aligned resin. The vanes 23 need not be identical among the twin fins 21. Because the twin fins 21 are not a unitary whole with the core 11 and are attached by their roots 27 to the core 11, twin fins 21 with vanes 23 that differ in size and shape can be connected with the core 11 via the grooves G.

The core 11 can also be made from a variety of thermally conductive materials including but not limited to aluminum (Al), copper (Cu), silver (Ag), gold (Au), alloys of those materials, and graphite. The core 11 can be a casting or it can be machined to shape. The groves G can be machined in the core 11 or they can be formed by the same casting process. The core 11 can have any shape and need not have a circular or cylindrical shape as depicted herein. The core 11 and the twin fins 21 can be made from dissimilar materials.

As an example, the core 11 can be made from graphite and the twin fins made from copper (Cu) or the core 11 can be made from copper (Cu) and the twin fins 21 from aluminum (Al). As an example, the core 11 can be made using a forging process or an impact forging process. A shape of the core 11 as well as the grooves G can be directly forged.

Figure 15:
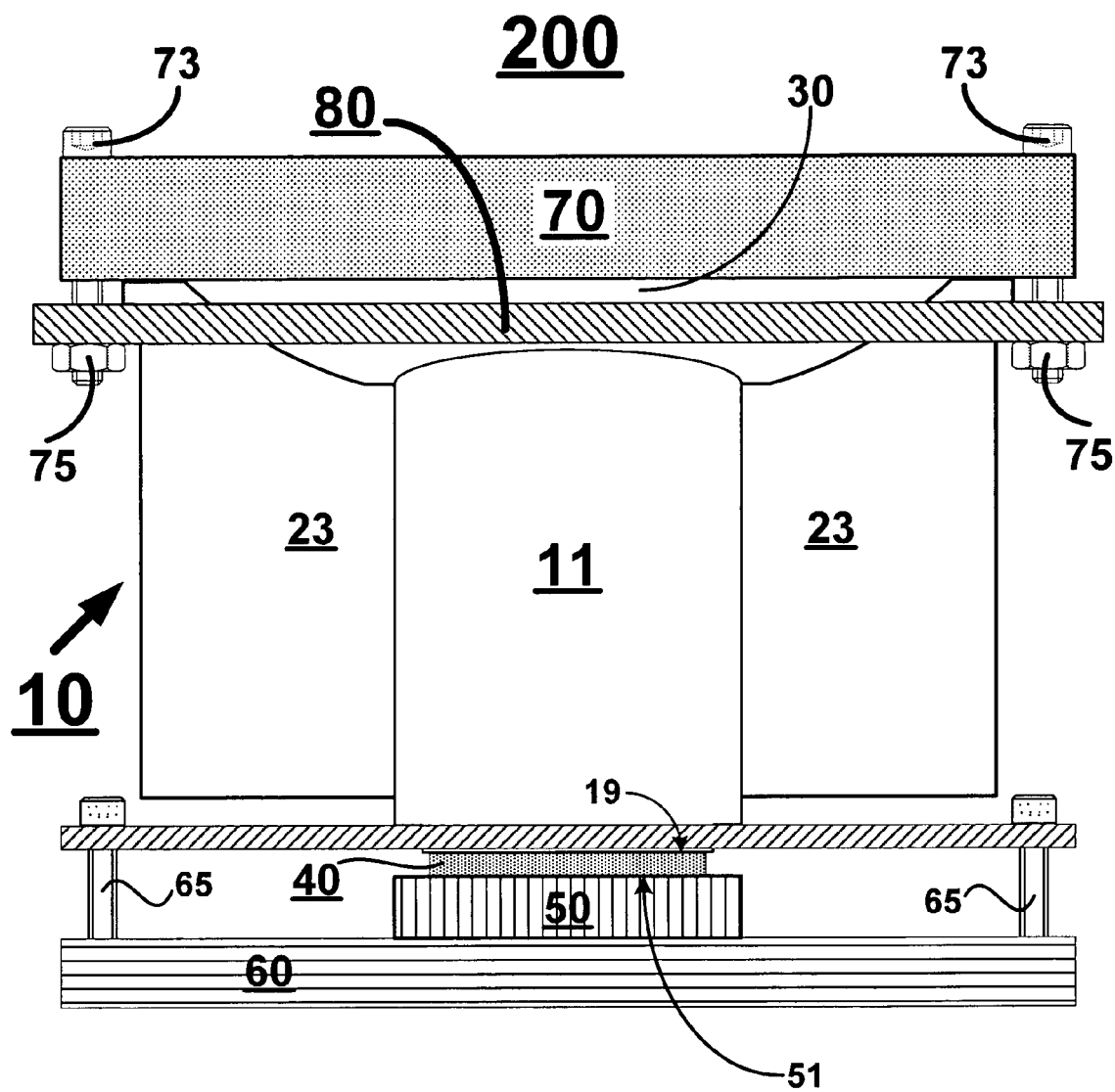
FIG. 15 is a side view of a system for dissipating heat from a component.

In FIGS. 12 and 15, a system 200 for dissipating waste heat from a component can include the cooling device 10 and the air flow source 70 as described above. The air flow source 70 can be an electrical fan, for example. Additionally, the system 200 can include the base plate 100 for mounting the system 200 with the component 50 so that the mounting surface 19 is in thermal communication with the component 50 to be cooled as was described above. The thermal interface material 40 can be used to thermally communicate the waste heat $H_W$ from the component 50 to the mounting surface 19 and into the core 11. The base plate 100 can be mounted on a substrate 60, such as a PC board, for example, that carries the component 50. The base plate 100 can be mounted with the substrate 60 using fasteners 65 inserted through the mounting holes 101 in the base plate 100.

Although several embodiments of the present invention have been disclosed and illustrated, the invention is not limited to the specific forms or arrangements of parts so described and illustrated. The invention is only limited by the claims.

What is claimed is:

1. A cooling device for dissipating heat from a component, comprising:
    a plurality of separate twin fins with each twin fin including a root and a pair of vanes extending radially outward of the root and spaced apart from the root to define a first slot between the vanes; and
    a core including a plurality of grooves adapted to respectively receive the plurality of roots, and a base including a mounting surface adapted to thermally connect the core with the component;
    wherein each vane forms a second slot between itself and a vane of a neighboring twin fin, the first and second slots being of substantially the same radial length; and
    wherein heat thermally conducted into the core is dissipated by an air flow over the vanes through the slots to cool the component.

2. The cooling device as set forth in claim 1, wherein the grooves extend inward of a surface of the core.

3. The cooling device as set forth in claim 1, wherein each groove comprises a pair of spaced apart projections that extend outward of a surface of the core.

4. The cooling device as set forth in claim 1, wherein the grooves are aligned with an axis of the core.

5. The cooling device as set forth in claim 1, wherein the vanes include a profile selected from the group consisting of a planar profile, an arcuate profile, and an angular profile.

6. The cooling device as set forth in claim 1, wherein the base is inset from a surface of the core.

7. The cooling device as set forth in claim 6 and further compnsing:
    a base plate including a top surface, a bottom surface and an aperture extending between the top and bottom surfaces, the aperture being adapted to receive the base of the core, and the base plate being configured to position the mounting surface of the cooling device in thermal communication with the component.

8. The cooling device as set forth in claim 1 and further comprising:
    a thermal interface material positioned on the mounting surface.

9. The cooling device as set forth in claim 1, wherein the mounting surface includes a cavity inset from the mounting surface and adapted to receive a thermal interface material.

10. The cooling device as set forth in claim 9 and further comprising:
    a thermal interface material positioned in the cavity.

11. The cooling device as set forth in claim 1, wherein the root of each twin fin is fixedly connected with the groove.

12. The cooling device as set forth in claim 11, wherein each root is fixedly connected with the grooves using a process selected from the group consisting of welding, brazing, vacuum brazing, soldering, adhesively connecting, and gluing.

13. The cooling device as set forth in claim 1, wherein the grooves include a length that substantially spans an entirety of a length of a surface of the core and the root of each twin fin includes a length that is substantially equal to the length of the grooves.

14. The cooling device as set forth in claim 1, wherein each vane includes a leading edge characterized by a profile selected from the group consisting of a planar profile, an arcuate profile, a sloped profile, and a composite profile.

15. The cooling device as set forth in claim 1, wherein:
    the core includes a top face;
    each vane includes a leading edge; and
    the leading edges of the vanes form a chamber surrounding the top face of the core.

16. The cooling device as set forth in claim 1, wherein:
    the core includes a top face; and
    the top face of the core includes a profile selected from the group consisting of a planar profile, a sloped profile, and an arcuate profile.

17. The cooling device as set forth in claim 1, wherein each vane defines an outer edge that includes a lip extending outward of the outer edge and being adapted to receive a mounting ring for connecting an air flow device with cooling device.

18. The cooling device as set forth in claim 1, wherein the twin fins are made from a material selected from the group consisting of aluminum, copper, silver, gold, and alloys of those materials.

19. The cooling device as set forth in claim 1, wherein the core is made from a material selected from the group consisting of aluminum, copper, silver, gold, alloys of those materials, and graphite.

20. The cooling device as set forth in claim 1, wherein the core and the twin fins are made from dissimilar materials.

21. The cooling device as set forth in claim 1, wherein a shape of the vanes varies among the plurality of twin fins.

22. The cooling device as set forth in claim 1 and further comprising:
   a thermal interface material applied to a selected one of the root, the grooves, or the root and the grooves and operative to increase heat transfer from the core to the twin fins.

23. The cooling device as set forth in claim 1, wherein the grooves are aligned at an angle with an axis of the core.

24. The cooling device as set forth in claim 1, wherein the vanes include an arcuate profile.

25. The cooling device as set forth in claim 24, wherein the arcuate profile of the vanes matches a curvature of a fan blade.

26. A system for dissipating heat from a component, comprising:
   the cooling device as set forth in claim 1; and
   an air flow source for generating an air flow over the vanes through the slots to cool the component.

27. The system as set forth in claim 26 and further comprising:
   a base plate including a top surface, a bottom surface and an aperture extending between the top and bottom surfaces, the aperture being adapted to receive the base of the core, and the base plate being configured to position the mounting surface of the cooling device in thermal communication with the component.

28. The system as set forth in claim 26 and further comprising:
   a thermal interface material connected with the mounting surface.

29. A cooling device for dissipating heat from a component, comprising:
   a plurality of twin fins with each twin fin including a root and a pair of vanes extending from the root and spaced apart from the root to define a first slot between the vanes; and
   a core adapted to receive the plurality of roots, and including a base forming a mounting surface adapted to thermally connect the core with the component;
   wherein each vane forms a second slot between itself and a vane of a neighboring twin fin, the first and second slots being of substantially the same radial length;
   wherein heat thermally conducted into the core is dissipated by an air flow over the vanes through the slots to cool the component; and
   wherein the base is inset from a surface of the core.

30. The cooling device as set forth in claim 29 and further comprising:
   a base plate including a top surface, a bottom surface and an aperture extending between the top and bottom surfaces, the aperture being adapted to receive the base of the core, and the base plate being configured to position the mounting surface of the cooling device in thermal communication with the component.

31. A cooling device for dissipating heat from a component, comprising:
   a plurality of twin fins with each twin fin including a root and a pair of vanes extending from the root and spaced apart from the root to define a first slot between the vanes; and
   a core adapted to receive the plurality of roots, and including a base forming a mounting surface adapted to thermally connect the core with the component;
   wherein each vane forms a second slot between itself and a vane of a neighboring twin fin, the first and second slots being of substantially the same radial length;
   wherein heat thermally conducted into the core is dissipated by an air flow over the vanes through the slots to cool the component; and
   wherein the mounting surface includes a cavity inset from the mounting surface and adapted to receive a thermal interface material.

32. The cooling device as set forth in claim 31, and further comprising:
   a thermal interface material positioned in the cavity.

33. A cooling device for dissipating heat from a component, comprising:
   a plurality of twin fins with each twin fin including a root and a pair of vanes extending from the root and spaced apart from the root to define a first slot between the vanes; and
   a core adapted to receive the plurality of roots, and including a base forming a mounting surface adapted to thermally connect the core with the component;
   wherein each vane forms a second slot between itself and a vane of a neighboring twin fin, the first and second slots being of substantially the same radial length;
   wherein heat thermally conducted into the core is dissipated by an air flow over the vanes through the slots to cool the component; and
   wherein each vane defines an outer edge that includes a lip extending outward of the outer edge and being adapted to receive a mounting ring for connecting an air flow device with cooling device.

34. A cooling device for dissipating heat from a component, comprising:
   a plurality of twin fins with each twin fin including a root and a pair of vanes extending from the root and spaced apart to define a slot between the vanes; and
   a core adapted to receive the plurality of roots, and including a base forming a mounting surface adapted to thermally connect the core with the component;
   wherein heat thermally conducted into the core is dissipated by an air flow over the vanes through the slots to cool the component; and
   wherein a shape of the vanes varies among the plurality of twin fins.

35. A cooling device for dissipating heat from a component, comprising:
   a plurality of twin fins with each twin fin including a root and a pair of vanes extending from the root and spaced apart from the root to define a first slot between the vanes; and
   a core adapted to receive the plurality of roots, and including a base forming a mounting surface adapted to thermally connect the core with the component;
   wherein each vane forms a second slot between itself and a vane of a neighboring twin fin, the first and second slots bemnn of substantially the same radial length;
   wherein heat thermally conducted into the core is dissipated by an air flow over the vanes through the slots to cool the component; and
   wherein the vanes include an arcuate profile.

36. The cooling device as set forth in claim 35, wherein the arcuate profile of the vanes matches a curvature of a fan blade.

37. A cooling device for dissipating heat from a component, comprising:
- a plurality of twin fins with each twin fin including a root and a pair of vanes extending from the root and spaced apart from the root to define a first slot between the vanes;
- a core adapted to receive the plurality of roots, and including a base forming a mounting surface adapted to thermally connect the core with the component;
- an air flow source for generating an air flow over the vanes through the slots to dissipate heat thermally conducted into the core and thereby cool the component; and
- a base plate including a top surface, a bottom surface and an aperture extending between the top and bottom surfaces, the aperture being adapted to receive the base of the core, and the base plate being configured to position the mounting surface of the cooling device in thermal communication with the component;
- wherein each vane forms a second slot between itself and a vane of a neighboring twin fin, the first and second slots being of substantially the same radial length.

38. A cooling device for dissipating heat from a component, comprising: a plurality of separate twin fins with each twin fin including a root and a pair of vanes extending radially outward of the root and spaced apart to define a slot between the vanes; and
- a core including a plurality of grooves adapted to respectively receive the plurality of roots, and a base including a mounting surface adapted to thermally connect the core with the component;
- wherein heat thermally conducted into the core is dissipated by an air flow over the vanes through the slots to cool the component; and
- wherein each vane defines an outer edge that includes a lip extending outward of the outer edge and being adapted to receive a mounting ring for connecting an air flow device with cooling device.

39. A cooling device for dissipating heat from a component, comprising:
- a plurality of separate twin fins with each twin fin including a root and a pair of vanes extending radially outward of the root and spaced apart to define a slot between the vanes; and
- a core including a plurality of grooves adapted to respectively receive the plurality of roots, and a base including a mounting surface adapted to thermally connect the core with the component;
- wherein heat thermally conducted into the core is dissipated by an air flow over the vanes through the slots to cool the component; and
- wherein a shape of the vanes varies among the plurality of twin fins.

* * * * *

UNITED STATES PATENT AND TRADEMARK OFFICE
CERTIFICATE OF CORRECTION

PATENT NO. : 7,497,248 B2 Page 1 of 1
APPLICATION NO. : 10/837144
DATED : March 3, 2009
INVENTOR(S) : Shankar Hegde It is certified that error appears in the above-identified patent and that said Letters Patent is hereby corrected as shown below:

In column 2, line 37, delete "8g" and insert -- 8f --, therefor.

In column 8, line 17, in Claim 7, delete "compnsing" and insert -- comprising --, therefor.

In column 10, line 61, in Claim 35, delete "bemnn" and insert -- being --, therefor.

Signed and Sealed this

Twenty-seventh Day of October, 2009

David J. Kappos
*Director of the United States Patent and Trademark Office*